US012740063B2

(12) United States Patent
Kim et al.

(10) Patent No.: US 12,740,063 B2
(45) Date of Patent: Sep. 15, 2026

(54) SEMICONDUCTOR MEMORY DEVICE

(71) Applicant: Samsung Electronics Co., Ltd., Suwon-si (KR)

(72) Inventors: Ji Young Kim, Hwaseong-si (KR); Woo Sung Yang, Gwangmyeong-si (KR); Sung-Min Hwang, Hwaseong-si (KR); Suk Kang Sung, Seongnam-si (KR); Joon-Sung Lim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 192 days.

(21) Appl. No.: 18/595,737

(22) Filed: Mar. 5, 2024

(65) Prior Publication Data

US 2024/0215245 A1 Jun. 27, 2024

Related U.S. Application Data

(63) Continuation of application No. 17/203,122, filed on Mar. 16, 2021, now Pat. No. 11,956,957.

(30) Foreign Application Priority Data

Jul. 24, 2020 (KR) ........................ 10-2020-0092598

(51) Int. Cl.
*H10B 43/27* (2023.01)
*H10B 41/10* (2023.01)
(Continued)

(52) U.S. Cl.
CPC ............. *H10B 43/27* (2023.02); *H10B 41/10* (2023.02); *H10B 41/27* (2023.02); *H10B 43/10* (2023.02)

(58) Field of Classification Search
CPC ........ H10B 41/00–70; H10B 43/00–50; G11C 16/0408–0458; G11C 16/0483;
(Continued)

(56) References Cited

U.S. PATENT DOCUMENTS 8,742,466 B2 6/2014 Shim et al.
9,455,272 B2 9/2016 Lee
(Continued)

FOREIGN PATENT DOCUMENTS

CN 104425505 A 3/2015
CN 110931502 A 3/2020
(Continued)

OTHER PUBLICATIONS

Korean Office Action for corresponding Korean Patent Application No. 10-2020-0092598 issued on May 31, 2024.
(Continued)

*Primary Examiner* — Matthew C Landau
*Assistant Examiner* — Nora T. Nix
(74) *Attorney, Agent, or Firm* — HARNESS, DICKEY & PIERCE, P.L.C.

(57) ABSTRACT

A semiconductor memory device includes a first stacked structure, a first supporter layer, a second stacked structure, a block cut structure, and a second supporter layer on the second stacked structure and separated by a second cut pattern. The first stacked structure includes a first and second stack, the second stacked structure includes a third stack separated by the block cut structure and a fourth stack, the first supporter layer is on the first stack and the second stack, the second supporter layer is on the third stack and the fourth stack, the first cut pattern includes a first connection on the block cut structure and connecting the first supporter layer and the second stack, and the second cut pattern of the second supporter layer includes a second connection on the
(Continued)

block cut structure and connecting the second supporter layer placed on the third stack and the fourth stack.

20 Claims, 31 Drawing Sheets

(51) Int. Cl.
*H10B 41/27* (2023.01)
*H10B 43/10* (2023.01)

(58) Field of Classification Search
CPC ....... G11C 11/5621–5642; G11C 2216/06–10; G11C 16/0466–0475; G11C 27/005; G11C 11/5671
See application file for complete search history.

(56) References Cited

U.S. PATENT DOCUMENTS 10,418,374 B2 9/2019 Lee et al.
10,553,602 B2 2/2020 Lee
2012/0061744 A1* 3/2012 Hwang .................. H10B 43/20 257/E27.081
2015/0069484 A1* 3/2015 Lee ........................ H10B 43/27 257/314
2016/0086968 A1 3/2016 Yang et al.
2017/0200676 A1 7/2017 Jeong et al.
2018/0269222 A1 9/2018 Huang et al.
2019/0221557 A1* 7/2019 Kim ....................... H10B 43/10
2019/0245032 A1 8/2019 Yang et al.
2019/0393239 A1 12/2019 Lee et al.
2020/0258898 A1 8/2020 Hu et al.
2021/0335801 A1 10/2021 Yang et al.
2023/0033086 A1 2/2023 Wang et al.

FOREIGN PATENT DOCUMENTS

KR 10-2015-0029403 A 3/2015
KR 10-2020-0033370 A 3/2020

OTHER PUBLICATIONS

Chinese Office Action dated May 25, 2026 for corresponding Chinese Patent Application No. 202110828263.1 and its English-language translation.

* cited by examiner

SEMICONDUCTOR MEMORY DEVICE

CROSS-REFERENCE TO RELATED APPLICATIONS

This application is a Continuation application of U.S. application Ser. No. 17/203,122, filed on Mar. 16, 2021, which claims priority under 35 U.S.C. § 119 to Korean Patent Application No. 10-2020-0092598, filed on Jul. 24, 2020 in the Korean Intellectual Property Office, the disclosures of each of which are hereby incorporated by reference in their entirety.

BACKGROUND

Some example embodiments of inventive concepts relate to a semiconductor memory device.

In order to satisfy/meet excellent/high performance and low price required/desired by consumers, the degree of integration of the semiconductor memory device increases. In the case of a two-dimensional or planar semiconductor memory device, the degree of integration is determined by an area occupied by unit memory cells. Therefore, recently, a three-dimensional semiconductor memory device in which the unit memory cells are placed vertically has been developed.

Further, in order to improve the degree of integration of semiconductor elements, the number of layers of word lines vertically stacked in the semiconductor memory device increases. As a result, research on a multi-stack structure in which a plurality of stack structures is stacked is being conducted.

SUMMARY

Some example embodiments of inventive concepts provide a semiconductor memory device with improved product reliability, and/or a method of manufacturing the same.

According to some example embodiments of inventive concepts, a semiconductor memory device includes a first stacked structure on a substrate, the first stacked structure including first gate electrodes stacked in a first direction, a first supporter layer on the first stacked structure, the first supporter layer divided by a first cut pattern, a second stacked structure on the first supporter layer, the second stacked structure including second gate electrodes stacked in the first direction, a block cut structure extending in a second direction intersecting the first direction and cutting at least one of the second stacked structure or the first stacked structure, a second supporter layer on the second stacked structure and divided by a second cut pattern, and a channel structure including a lower channel structure penetrating the first stacked structure, and an upper channel structure penetrating the first supporter layer and the second stacked structure. A width of an upper face of the channel structure in a third direction intersecting the second direction is greater than a width of a lower surface of the channel structure in the third direction, a width of an uppermost face of the lower channel structure in the second direction is greater than a width of a lowermost face of the upper channel structure in the second direction. The first stacked structure includes a first stack and a second stack which are at least partially divided by the block cut structure. The second stacked structure includes a third stack on the first stack, and a fourth stack on the second stack, the third stack and the fourth stack separated by the block cut structure. The first supporter layer is on the first stack and the second stack.

The second supporter layer is on the third stack and the fourth stack. The first cut pattern of the first supporter layer includes a first connection on the block cut structure, the first connection connecting the first supporter layer on the first stack with the second stack. The second cut pattern of the second supporter layer includes a second connection on the block cut structure, the second connection connecting the second supporter layer on the third stack with the fourth stack.

According to some example embodiments of inventive concepts, a semiconductor memory device includes a first stacked structure on a substrate, the first stacked structure including first gate electrodes stacked in a first direction, a first supporter layer on the first stacked structure, a second stacked structure on the first stacked structure, the second stacked structure including second gate electrodes stacked in the first direction, a plurality of first sub-cut structures cutting the first stacked structure and the second stacked structure and arranged in a second direction intersecting the first direction, a second sub-cut structure between the first sub-cut structures, the first sub-cut structures being spaced apart from each other in the second direction and being among the plurality of first sub-cut structures, the second sub-cut structure cutting the second stacked structure, a channel structure which including lower channel structure penetrating the first stacked structure and an upper channel structure penetrating the first supporter layer and the second stacked structure, wherein side walls of the channel structure have a step, and a second supporter layer on the second stacked structure. The first supporter layer includes a first cut pattern through which the plurality of first sub-cut structures penetrates. The second supporter layer includes a second cut pattern which exposes at least a part of upper faces of the plurality of first sub-cut structures and exposes the second sub-cut structure. An area of the first cut pattern is different from an area of the second cut pattern.

According to some example embodiments of inventive concepts, a semiconductor memory device includes a common source plate on a substrate, a first stacked structure on the common source plate, the first stacked structure including first gate electrodes stacked in a first direction, a first supporter layer on the first stacked structure and separated in a second direction intersecting the first direction, the first supporter layer separated by a first cut pattern, a second stacked structure on the first stacked structure, the second stacked structure including second gate electrodes stacked in the first direction, a plurality of first sub-cut structures cutting the first stacked structure and the second stacked structure and arranged in the second direction, a second sub-cut structure between the first sub-cut structures that are spaced apart from each other in the second direction and being among the plurality of first sub-cut structures, the second sub-cut structure cutting the second stacked structure, a channel structure including (a) a lower channel structure penetrating the first stacked structure, and (b) an upper channel structure penetrating the first supporter layer and the second stacked structure, side walls of the channel structure having a step, a second supporter layer on the second stacked structure and separated in the second direction by a second cut pattern, and a bit line on the second supporter layer, the bit line extending in a third direction intersecting the first direction and the second direction, the bit line connected to the channel structure. The first stacked structure includes a first stack and a second stack separated from each other by the plurality of first sub-cut structures, and a first connection stack below the second sub-cut structure, the first stacked structure connecting the first stack and the second stack. The second stacked structure includes third stacks separated from each other by the plurality of first sub-cut structures and the second sub-cut structure and placed on the first stack, and a fourth stack on the second stack. The first cut pattern includes a plurality of first connections which overlaps the plurality of first sub-cut structures and the second sub-cut structure in the first direction, the first cut pattern on the first connection stack in the second direction. The second cut pattern includes a plurality of second connections which overlaps the plurality of first sub-cut structures and the second sub-cut structure in the first direction, the second cut pattern arranged in the second direction. A number of the plurality of first connections is greater than a number of the plurality of second connections.

However, aspects of inventive concepts are not restricted to the one set forth herein. The above and other aspects of inventive concepts will become more apparent to one of ordinary skill in the art to which inventive concepts pertains by referencing the detailed description of inventive concepts given below.

BRIEF DESCRIPTION OF THE DRAWINGS

The above and other aspects and features of inventive concepts will become more apparent by describing in detail some example embodiments thereof referring to the attached drawings, in which.

DETAILED DESCRIPTION OF EXAMPLE EMBODIMENTS

Figure 1:
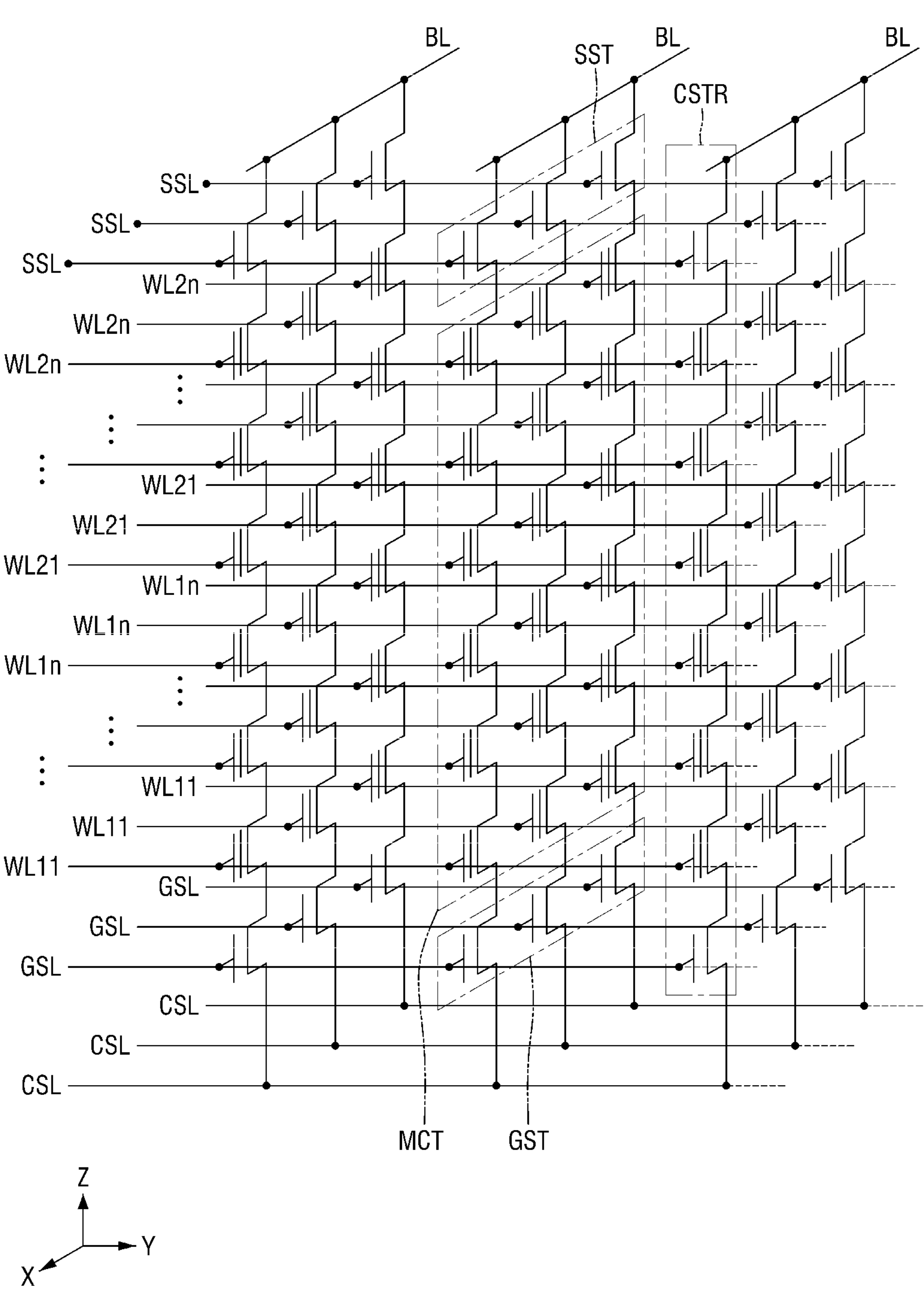
FIG. 1 is an example circuit diagram for explaining a semiconductor memory device according to some example embodiments.

FIG. 1 is an example circuit diagram for explaining a semiconductor memory device according to example embodiments.

Referring to FIG. 1, a memory cell array of the semiconductor memory device according to some example embodiments may include a common source line CSL, stacked structures ST1 and ST2, a plurality of bit lines BL, and a plurality of cell strings CHTR.

The first stacked structure ST1 may include a ground selection line GSL and a plurality of first gate electrodes WL11 to WL1*n*. The second stacked structure ST2 may include a plurality of second gate electrodes DWL2 and WL21 to WL2*n* and a string selection line SSL. Although two stacked structures ST1 and ST2 are shown in this drawing, inventive concepts are not limited thereto, and three or more stacked structures may be included.

A plurality of cell strings CHTR may be connected in parallel to each of the bit lines BL. The plurality of cell strings CHTR may be connected in common to the common source line CSL. For example, a plurality of cell strings CHTR may be placed between the bit line BL and one common source line CSL. The plurality of common source lines CSL may be placed two-dimensionally. The same voltage may be electrically applied to the common source lines CSL, or different voltages may be applied to the common source lines CSL, and the common source lines CSL may be controlled separately.

Each cell string CSTR may include, for example, a ground selection transistor GST connected to the common source line CSL, a string selection transistor SST connected to each of a plurality of bit lines BL, and a plurality of memory cell transistors MCT placed between the ground selection transistor GST and the string selection transistor SST. For example, the ground selection transistor GST, the string selection transistor SST, and the memory cell transistor MCT may be connected in series. Each memory cell transistor MCT may include a data storage element, such as a floating gate transistor.

Although not shown in this drawing, each cell string CHTR may include dummy cell transistors connected between the ground selection transistor GST and the memory cell transistor MCT and/or dummy cell transistors connected between the string selection transistor SST and the memory cell transistor MCT. The dummy cell transistors may not be electrically active during operation of the semiconductor device. Further, each cell string may additionally include a GIDL (Gate Induced Drain Leakage)

transistor connected between the common source line CSL and the ground selection line GSL. The GIDL transistor may help mitigate the effects of gate induced drain leakage of transistors within the semiconductor device.

The common source line CSL may be commonly connected to sources of the ground selection transistor GST. Also, a plurality of gate electrodes (e.g., the ground selection line GSL, the plurality of word lines WL1 to WLn and the string selection line SSL) may be placed between the common source line CSL and each of the bit lines BL.

The ground selection line GSL may be used as a gate electrode of the ground selection transistor GST, a plurality of word lines WL11 to WL1*n* and WL21 to WL2*n* may be used as gate electrodes of the memory cell transistors MCT, and the string selection line SSL may be used as a gate electrode of the string selection transistor SST. Although both of the ground selection transistor GST and the string selection transistor SST are illustrated as NMOS transistors, example embodiments are not limited thereto. Furthermore dimensions such as gate widths and/or gate lengths, and/or electrical characteristics such as threshold voltages may be the same, or different, between the ground selection transistor GST and the string selection transistor SST.

Figure 2:
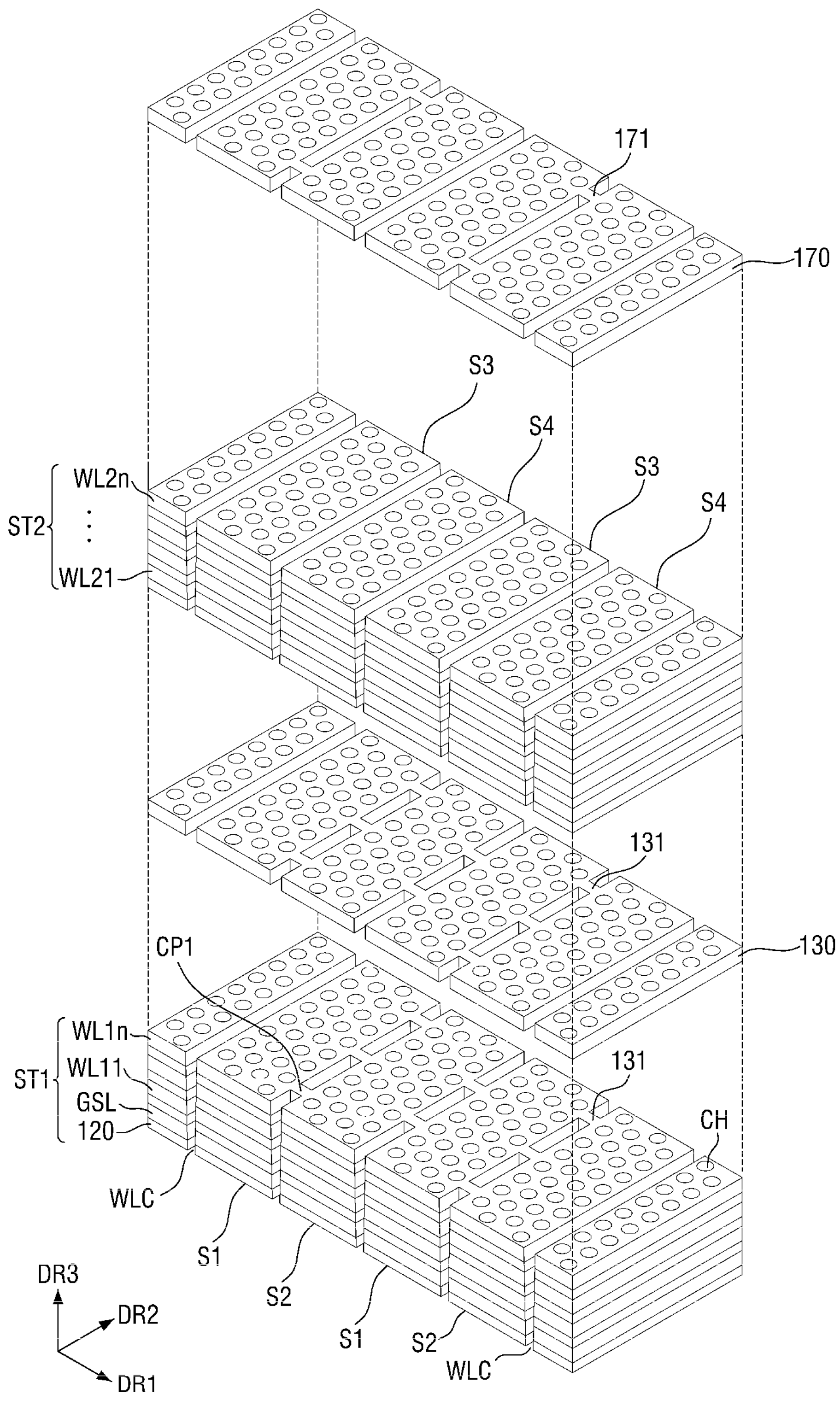
FIG. 2 is a partially exploded schematic perspective view for explaining the semiconductor memory device according to some example embodiments.
Figure 3A:
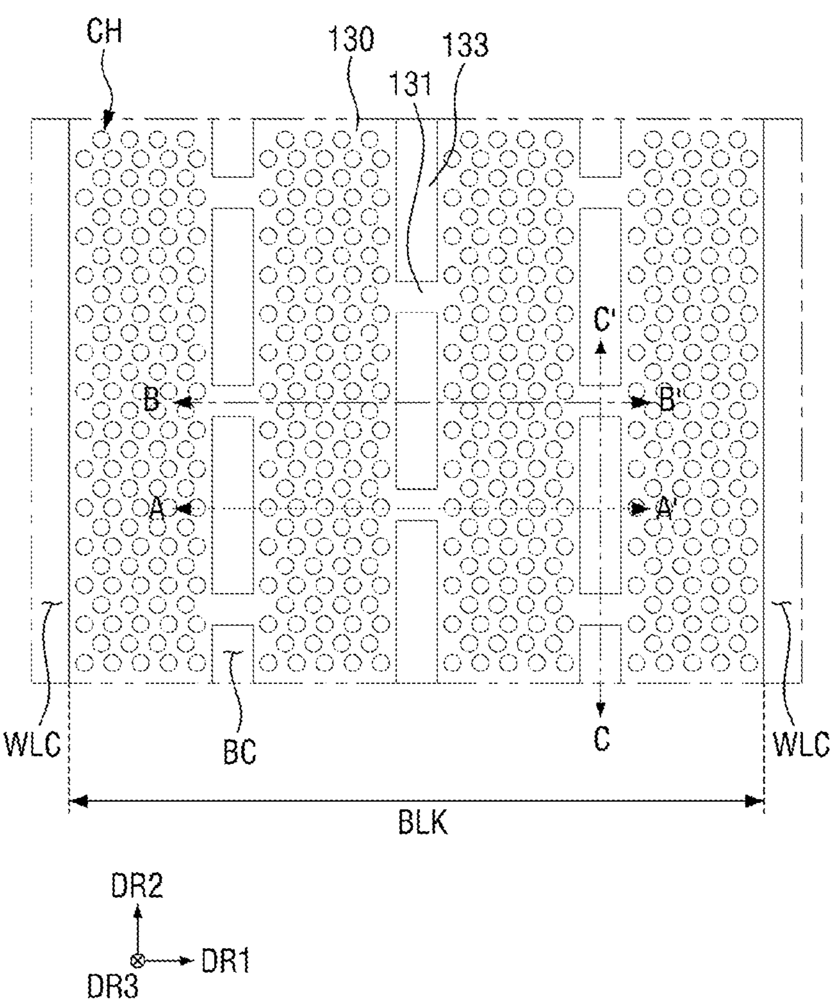
FIG. 3A is a layout diagram of a first supporter layer of FIG. 2.
Figure 3B:
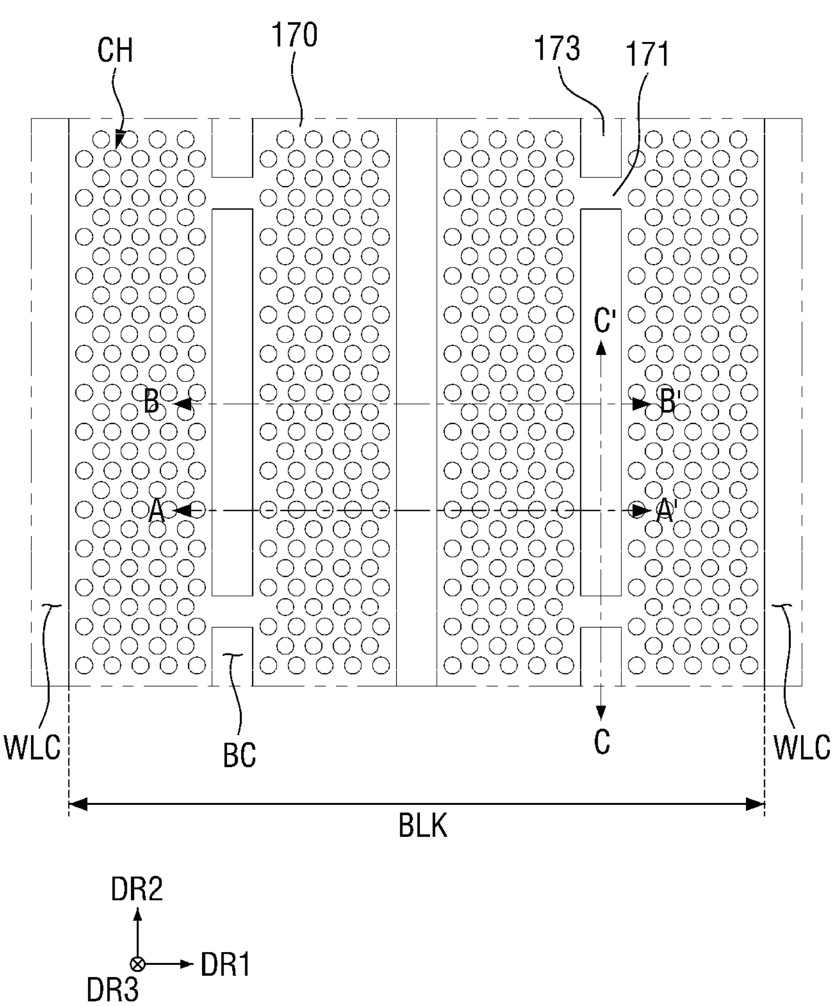
FIG. 3B is a layout diagram of a second supporter layer of FIG. 2.
Figure 4:
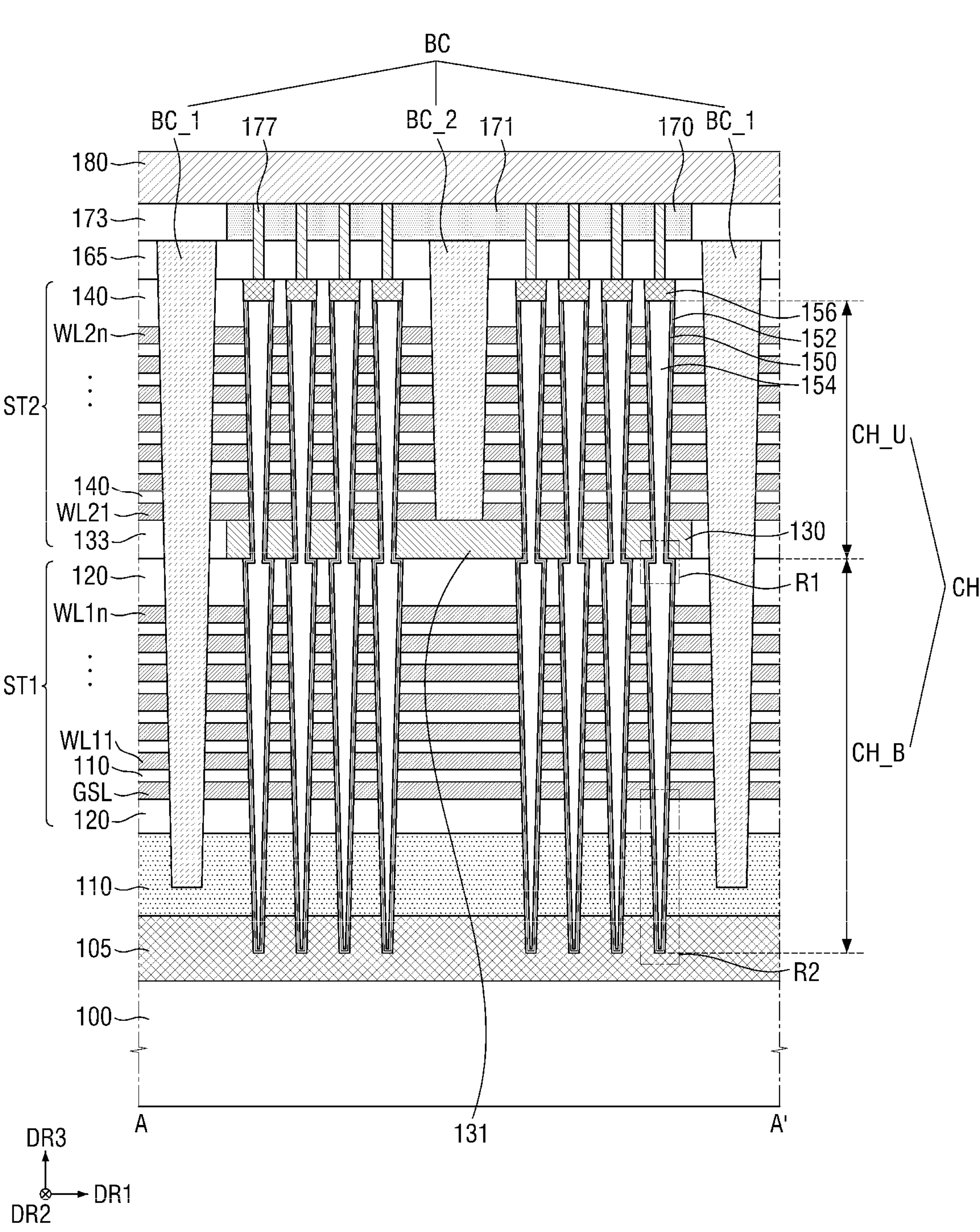
FIG. 4 is a cross-sectional view taken along a line A-A' of FIG. 3A.
Figure 5:
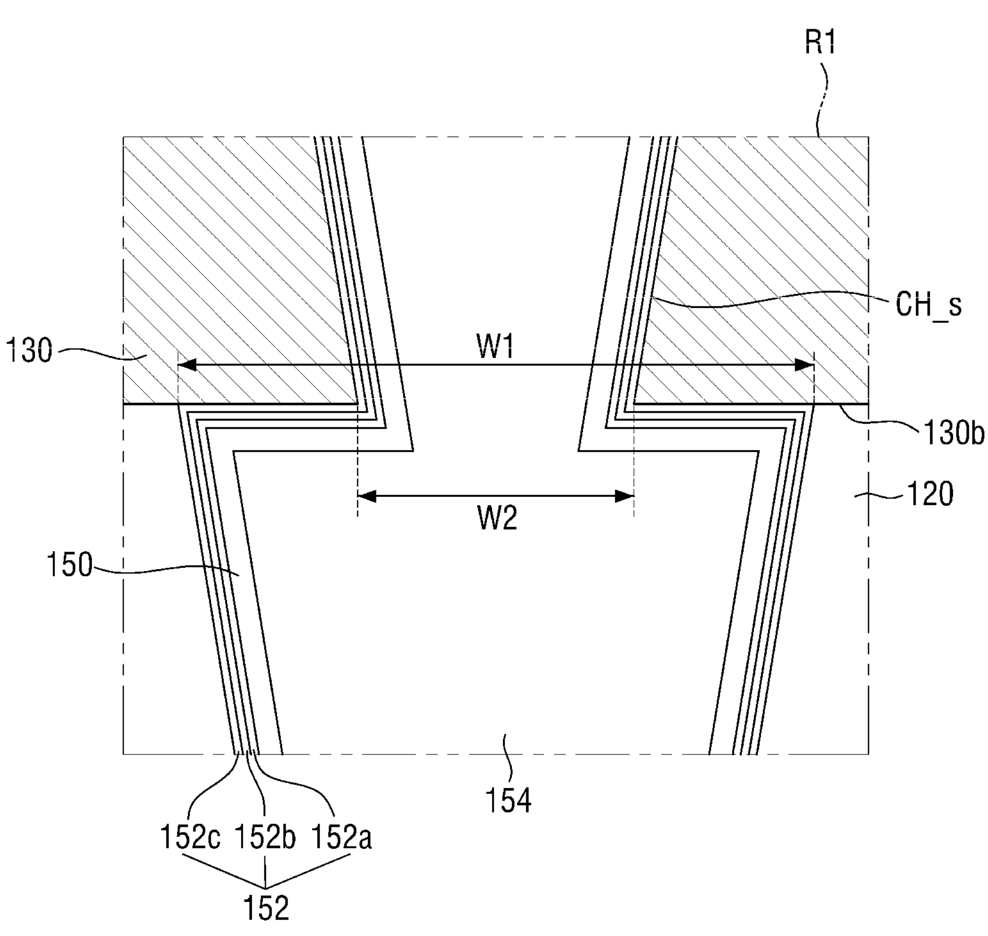
FIG. 5 is an enlarged view of R1 of FIG. 4.
Figure 6:
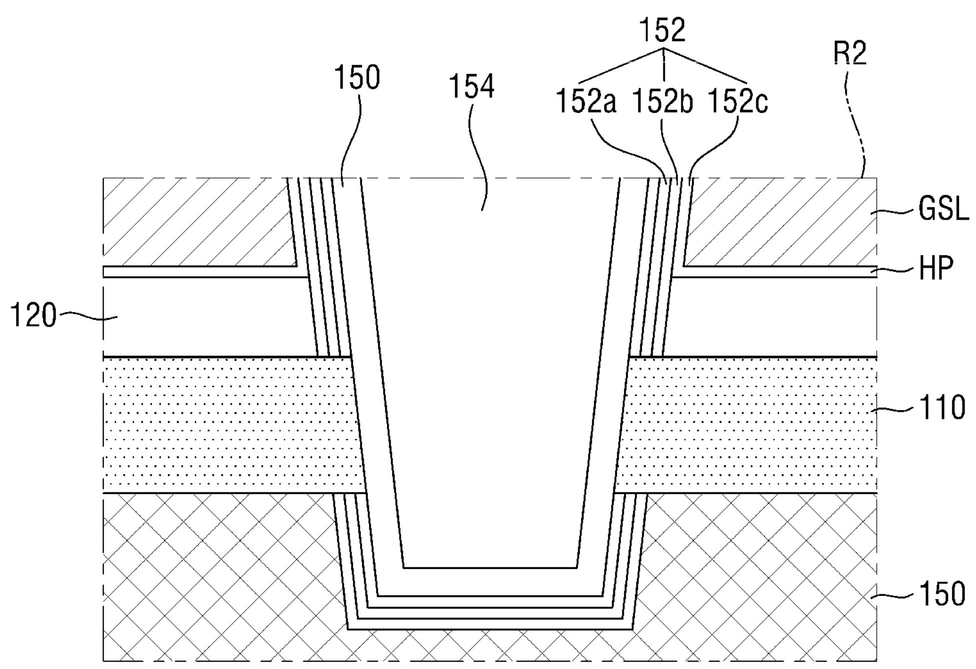
FIG. 6 is an enlarged view of R2 of FIG. 4.
Figure 7:
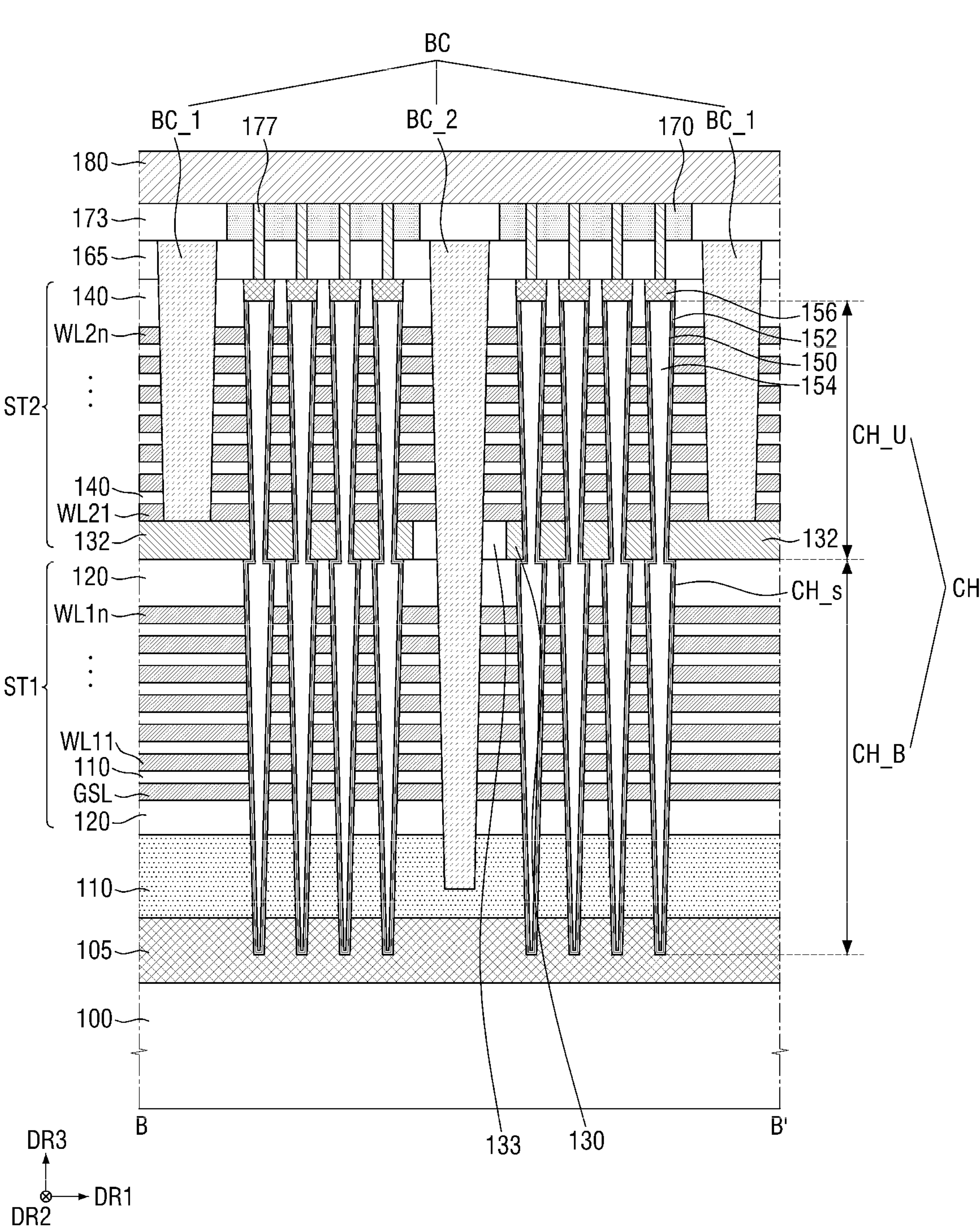
FIG. 7 is a cross-sectional view taken along a line B-B' of FIG. 3A.
Figure 8:
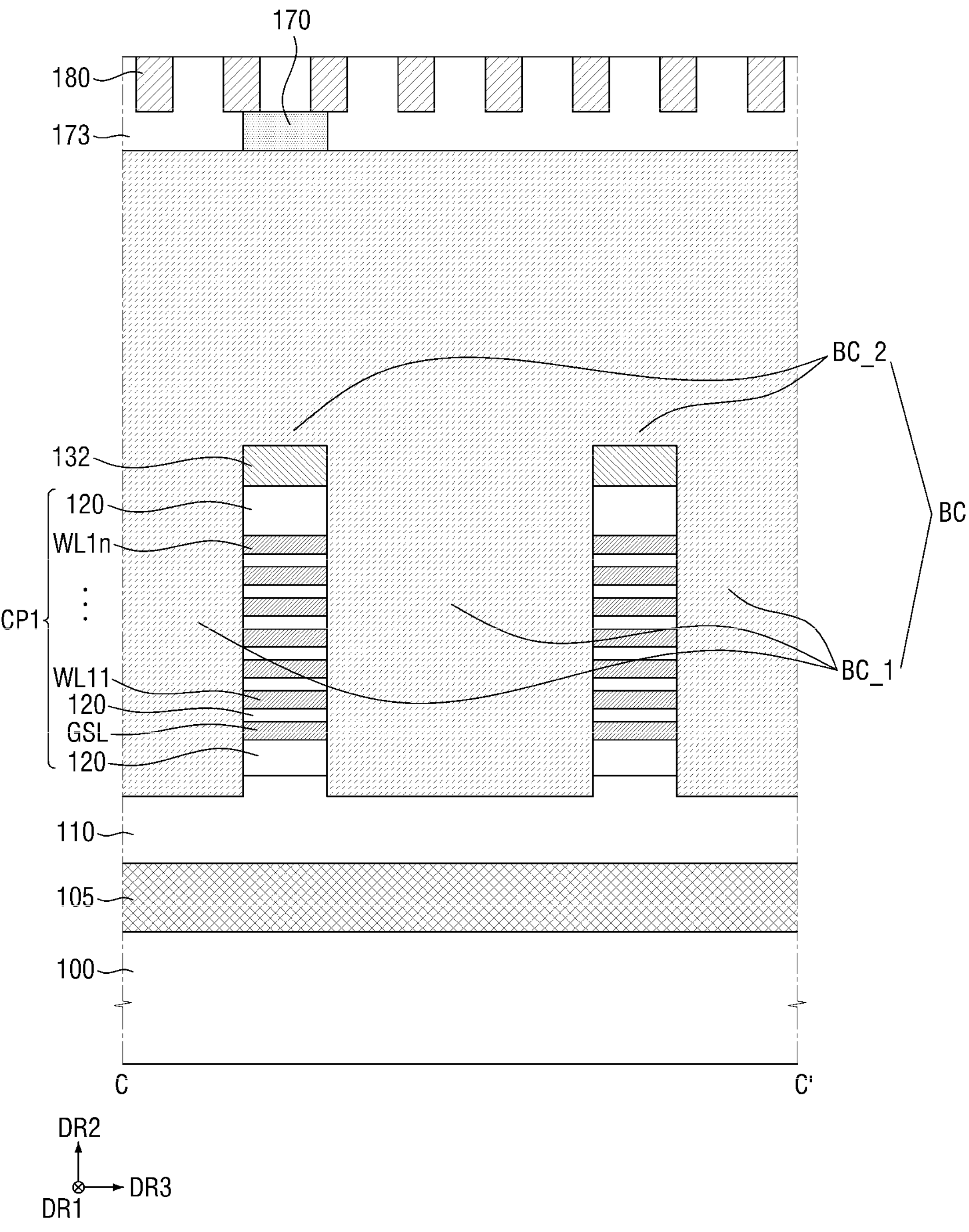
FIG. 8 is a cross-sectional view taken along a line C-C' of FIG. 3A.

FIG. 2 is a partially exploded schematic perspective view for explaining the semiconductor memory device according to some example embodiments. FIG. 3A is a layout diagram of the first supporter layer of FIG. 2. FIG. 3B is a layout diagram of the second supporter layer of FIG. 2. FIG. 4 is a cross-sectional view taken along the line A-A' of FIG. 3A. FIG. 5 is an enlarged view of R1 of FIG. 4. FIG. 6 is an enlarged view of R2 of FIG. 4. FIG. 7 is a cross-sectional view taken along the line B-B' of FIG. 3A. FIG. 8 is a cross-sectional view taken along the line C-C' of FIG. 3A.

Referring to FIGS. 2 to 8, the semiconductor memory device according to some example embodiments includes a substrate 100, a common source plate 105, a support semiconductor layer 110, a first stacked structure ST1, a first supporter layer 130, a second stacked structure ST2, a channel structure CH, a second supporter layer 170 and a bit line BL.

The substrate 100 may be or include bulk silicon such as undoped or lightly doped single crystal silicon, or SOI (silicon-on-insulator). Alternatively, the substrate 100 may be or include a silicon substrate or may include other materials, for example, but is not limited to, silicon germanium, SGOI (silicon germanium on insulator), indium antimonide, lead tellurium compounds, indium arsenide, indium phosphide, gallium arsenide or gallium antimonide.

The common source plate 105 may be placed on the substrate 100. The common source plate 105 may serve as the common source line CSL of FIG. 1.

The common source plate 105 may include at least one of a conductive semiconductor film, a metal silicide film, or a metal film. When the common source plate 105 includes a conductive semiconductor film, the common source plate 105 may include, for example, at least one of silicon (Si), germanium (Ge), silicon germanium (SiGe), gallium arsenide (GaAs), indium gallium arsenide (InGaAs), aluminum gallium arsenide (AlGaAs) or a combination thereof. The common source plate 105 may have a structure including at least one selected from a single crystal, an amorphous, and polycrystalline structure. The common source plate 105 may include at least one of p-type impurities such as boron, n-type impurities such as phosphorus and/or arsenic, and group IV dopants such as carbon included in the semiconductor film. The common source plate 105 may be formed with an epitaxial process, and/or another process such as a chemical vapor deposition (CVD) process.

The support semiconductor layer 110 may be placed on the common source plate 105. The support semiconductor layer 110 may include, for example, but is not limited to, doped or undoped polysilicon. The support semiconductor layer 110 may include, for example, a semiconductor material such as silicon (Si), germanium (Ge) or a mixture thereof.

The first stacked structure ST1 may be placed on the support semiconductor layer 110. The first stacked structure ST1 may include a plurality of first gate electrodes GSL and WL11 to WL1*n* and a plurality of first insulating layers 120 which are alternately stacked on the support semiconductor layer 110. For example, each of the first gate electrodes GSL and WL11 to WL1*n* and each first insulating layer 120 may have a layered structure extending in a first direction DR1 and a second direction DR2. The first gate electrodes GSL and WL11 to WL1*n* and the first insulating layer 120 may be stacked alternately in a third direction DR3 intersecting (e.g., perpendicular) to an upper face of the substrate 100. The first gate electrodes GSL and WL11 to WL1*n* and the first insulating layer 120 may be formed, e.g. with a CVD process and/or an atomic layer deposition (ALD) process.

In some example embodiments, the plurality of first gate electrodes GSL and WL11 to WL1*n* may include a ground selection line GSL and a plurality of first word lines WL11 to WL1*n* which are sequentially stacked on the substrate 100. In some example embodiments, the ground selection line GSL may be a gate electrode located at a lowermost part of a plurality of first gate electrodes GSL and WL11 to WL1*n*.

The first supporter layer 130 may be placed on the first stacked structure ST1. The first supporter layer 130 may be separated by/divided by a plurality of first cut patterns 133 extending in the second direction DR2. Alternatively or additionally, the plurality of first cut patterns 133 may be spaced apart from each other in the first direction DR1. Accordingly, the first supporter layers 130 may be spaced apart from each other in the first direction DR1.

Each first cut pattern 133 may include a plurality of first connections 131. The plurality of first connections 131 may be spaced apart from each other in the second direction DR2 inside each first cut pattern 133. The plurality of first connections 131 may be connected to the first supporter layers 130 separated from each other by the respective first cut patterns 133. For example, the first supporter layers 130 spaced apart from each other in the first direction DR1 may be connected to each other by the plurality of first connections 131.

The number of plurality of first connections 131 included in each first cut pattern 133 may be the same as, or different for each first cut pattern 133. Further, the arrangement of the plurality of first connections 131 included in each first cut pattern 133 may also be the same as, or different for each first cut pattern 133.

The first supporter layer 130 and the first connection 131 may be of the same material or may include the same material. The first supporter layer 130 and the first connection 131 may include a material having a higher etching selectivity than silicon oxide and/or silicon nitride. The first supporter layer 130 and the first connection 131 may include, but are not limited to, for example, polysilicon including ALO, metal material and/or impurities.

The first cut pattern 133 may include, for example, but is not limited to, silicon oxide.

The second stacked structure ST2 may be placed on the first supporter layer 130. The second stacked structure ST2 may include a plurality of second gate electrodes WL21 to WL2*n* and a plurality of second insulating layers 140 which are alternately stacked on the first supporter layer 130. For example, each of the second gate electrodes WL21 to WL2*n* and each second insulating layer 140 may have a layered structure extending in the first direction DR1 and the second direction DR2. A number of first gate electrodes WL11 to WL1*n* may be the same as, or different from, a number of second gate electrodes WL21 to WL2*n*.

In some example embodiments, the string selection line SSL may be or correspond to a gate electrode located at the uppermost part of the plurality of second gate electrodes WL21 to WL2*n*.

The first gate electrodes GSL and WL11 to WL1*n* and the second gate electrodes WL21 to WL2*n* may include a conductive material. For example, the first gate electrodes GSL and WL11 to WL1*n* and the second gate electrodes WL21 to WL2*n* and SSL may include, but are not limited to, at least one of metals such as tungsten (W), cobalt (Co), nickel (Ni) or a semiconductor material such as silicon such as doped polysilicon.

The first insulating layer 120 and the second insulating layer 140 may include an insulating material. For example, the first insulating layer 120 and the second insulating layer 140 may include, but are not limited to, silicon oxide.

The plurality of channel structures CH may penetrate the first stacked structure ST1 and the second stacked structure ST2. Further, the plurality of channel structures CH may extend in a direction intersecting the plurality of gate electrodes GSL, WL11 to WL1*n* and WL21 to WL2*n*. For example, each channel structure CH may extend in a third direction DR3. The third direction DR3 may be perpendicular to a surface of the substrate 100.

The channel structure CH may include a lower channel structure CH_B penetrating the first stacked structure ST1, and an upper channel structure CH_U penetrating the second stacked structure ST2. The lower channel structure CH_B and the upper channel structure CH_U may be continuously connected, e.g. directly connected. For example, the lower channel structure CH_B and the upper channel structure CH_U may be or correspond to a single body.

A width of a lower face of the lower channel structures CH_B in the first direction DR1 may be less than a width of an upper face of the lower channel structures CH_B in the first direction DR1. The width of the lower channel structure CH_B in the first direction DR1 may increase as it extends away from the upper face of the substrate 100. For example, the lower channel structure CH_B may have a tapered shape. This may be due to the characteristics of the etching process, e.g. an anisotropic dry etching process, used in the formation of the lower channel structure CH_B.

A width of a lower face of the upper channel structure CH_U in the first direction DR1 may be less than a width of an upper face of the upper channel structure CH_U in the first direction DR1. For example, the upper channel structures CH_U may have a tapered shape. The width of the upper channel structure CH_U in the first direction DR1 may increase as it extends away from the upper face of the substrate 100. This may be due to the characteristics of the etching process, e.g. an anisotropic dry etching process, used in the formation of the upper channel structure CH_U.

Referring, e.g., to FIG. 5, a width W1 of an uppermost face of the lower channel structure CH_B in the first direction DR1 may be greater than a width W2 of a lowermost face of the upper channel structure CH_U in the first direction DR1. For example, side walls CH_s of the channel structure CH may have a step. For example, the side walls CH_s of the channel structure CH may have a step on the lower face 130*b* of the first supporter layer 130. This may be due to the etching process of penetrating the first stacked structure ST1 and the etching process of penetrating the second stacked structure ST2 are performed separately, e.g. at separate etching process steps.

Each channel structure CH may include a semiconductor pattern 150 and an information storage pattern 152.

The semiconductor pattern 150 may penetrate the first stacked structure ST1 and the second stacked structure ST2. For example, the semiconductor pattern 150 may extend in the third direction DR3.

The semiconductor pattern 150 may be doped or undoped, and may include, but is not limited to, semiconductor materials such as, for example, at least one of single crystal silicon, polycrystalline silicon, organic semiconductor materials and carbon nanostructures.

The information storage pattern 152 may be interposed between the semiconductor pattern 150 and the respective gate electrodes GSL, WL11 to WL1*n* and WL21 to WL2*n*. For example, the information storage pattern 152 may extend along the side faces of the semiconductor pattern 150.

The information storage pattern 152 may include, for example, at least one of silicon oxide, silicon nitride, silicon oxynitride and a high-dielectric constant material having a higher dielectric constant than silicon oxide. The high-dielectric constant material may include, for example, at least one of aluminum oxide, hafnium oxide, lanthanum oxide, tantalum oxide, titanium oxide, lanthanum hafnium oxide, lanthanum aluminum oxide, dysprosium scandium oxide, and combinations thereof.

In example embodiments, the information storage pattern 152 may include a plurality of films. For example, as shown in FIG. 6, the information storage pattern 152 includes a tunnel insulating film 152*a*, a charge storage film 152*b*, and a blocking insulating film 152*c* which are sequentially stacked on the semiconductor pattern 150.

The tunnel insulating film 152*a* may include, for example, a silicon oxide and/or a high-dielectric constant material having a higher dielectric constant than silicon oxide (for example, aluminum oxide ($Al_2O_3$) and hafnium oxide ($HfO_2$)). The charge storage film 152*b* may include, for example, silicon nitride. The blocking insulating film 152*c* may include, for example, a silicon oxide and/or a high-dielectric constant material having a higher dielectric constant than silicon oxide (for example, aluminum oxide ($Al_2O_3$) and hafnium oxide ($HfO_2$)).

The tunnel insulating film 152*a*, the charge storage film 152*b* and the blocking insulating film 152*c* may be separated at the lower part of the channel structure CH. The support semiconductor layer 110 may be placed between the tunnel insulating film 152*a*, the charge storage film 152*b* and the blocking insulating film 152*c* separated from each other. The support semiconductor layer 110 may electrically connect the common source plate 105 and the semiconductor pattern 150.

Alternatively, unlike that shown in FIG. 6, when the support semiconductor layer 110 is not placed, the tunnel insulating film 152*a*, the charge storage film 152*b* and the blocking insulating film 152*c* may be separated on the bottom face of the channel structure CH. For example, the side walls of the semiconductor pattern 150 are not exposed, and the bottom face of the semiconductor pattern 150 may be exposed. The semiconductor pattern 150 may be electrically connected to the common source plate 105 through the exposed bottom face of the semiconductor pattern 150.

In some example embodiments, each channel structure CH may further include a filling pattern 154. The filling pattern 154 may be formed to fill the inside of the semiconductor pattern 150. For example, the semiconductor pattern 150 may extend along the side faces and bottom face of the filling pattern 154. The filling pattern 154 may be or include, for example, but is not limited to, silicon oxide.

In example embodiments, each channel structure CH may further include a channel pad 156. The channel pad 156 may be formed to be connected to the upper part of the semiconductor pattern 150. For example, the channel pad 156 may be formed in a second insulating layer 140 located at the uppermost part of the second stacked structure ST2.

Although the channel pad 156 is shown as being formed on the upper face of the semiconductor pattern 150 in FIGS. 4 and 7, example embodiments are not limited thereto. For example, the upper part of the semiconductor pattern 150 may also be formed to extend along the side faces of the channel pad 156. The channel pad 156 may include, for example, but is not limited to, impurity-doped polysilicon.

In some example embodiments, the plurality of channel structures CH may be arranged in a zigzag form. For example, as shown in FIGS. 2 and 3, the plurality of channel structures CH may be arranged alternately each other in the first direction DR1 and the second direction DR2. The plurality of channel structures CH arranged in a zigzag form may further improve the degree of integration of the nonvolatile memory device.

The first interlayer insulating film 165 and the second supporter layer 170 may be placed, e.g. sequentially placed on the second stacked structure ST2. The second supporter layer 170 may be separated by a plurality of second cut patterns 173 extending in the second direction DR2. Also, the plurality of second cut patterns 173 may be spaced apart from each other in the first direction DR1. Therefore, the second supporter layers 170 may be spaced apart from each other in the first direction DR1.

Each second cut pattern 173 may overlap each first cut pattern 133 in the third direction DR3.

Each second cut pattern 173 may include a plurality of second connections 171. The plurality of second connections 171 may be spaced apart from each other in the second direction DR2 inside the respective second cut patterns 173. The plurality of second connections 171 may be connected to the second supporter layers 170 separated from each other by the respective second cut patterns 173. For example, the second supporter layers 170 spaced apart from each other in the first direction DR1 may be connected to each other by a plurality of second connections 171.

The number of plurality of second connections 171 included in each second cut pattern 173 may be the same as, or different for each second cut pattern 173. Further, the arrangement of the plurality of second connections 171 included in each of the second cut patterns 173 may also be the same as, or different for each of the second cut patterns 173.

The second supporter layer 170 and the second connection 171 may be of the same or include the same material. The second supporter layer 170 and the second connection 171 may include a material different from the first supporter layer 130 and a first connection 131. The second supporter layer 170 and the second connection 171 may include, for example, oxides such as silicon oxide.

The first interlayer insulating film 165 and the second cut pattern 173 may include, for example, but are not limited thereto, silicon oxide.

A plurality of bit lines 180 may extend side by side to be spaced apart from each other. For example, each bit line 180 may extend in the first direction DR1. In some example embodiments, the plurality of bit lines 180 may be formed on the second supporter layer 170.

Each bit line 180 may be connected to a plurality of channel structures CH. For example, as shown in FIGS. 4 and 7, one of the plurality of bit lines BL may be connected to the plurality of channel structures CH through a bit line contact 177. The bit line contact 177 penetrates, for example, the first interlayer insulating film 165 and the second cut pattern 173 to electrically connect the bit line 180 and the channel structure CH.

The first stacked structure ST1 and the second stacked structure ST2 may be cut by a word line cut structure WLC. The word line cut structure WLC may extend in a direction intersecting the bit line 180. For example, the word line cut structure WLC may extend in the second direction DR2 to cut, e.g. completely cut the first stacked structure ST1 and the second stacked structure ST2.

Accordingly, the plurality of first gate electrodes GSL and WL11 to WL1*n* and the plurality of second gate electrodes WL21 to WL2*n* may be cut by the word line cut structure WLC. Additionally, the word line cut structures WLC may be spaced apart from each other in the first direction DR1. The first stacked structure ST1 and the second stacked structure ST2 may form a single block BLK by the word line cut structures WLC adjacent to each other.

The word line cut structure WLC may penetrate the first cut pattern 133 of the first supporter layer 130. Additionally, the second cut pattern 173 of the second supporter layer 170 may be placed on the word line cut structure WLC.

Between the word line cut structures WLC adjacent to each other, the first stacked structure ST1 and the second stacked structure ST2 may be cut by a plurality of block cut structures BC. Within one block, the plurality of block cut structures BC may extend in the second direction DR2 to cut the first stacked structure ST1 and/or the second stacked structure ST2.

The block cut structure BC may overlap the first cut pattern 133 of the first supporter layer 130 and the second cut pattern 173 of the second supporter layer 170 in the third direction DR3.

The block cut structure BC may include a first sub-cut structure BC_1 that completely cuts the first stacked structure ST1 and the second stacked structure ST2, and a second sub-cut structure BC_2 that only cuts the second stacked structure ST2. The second sub-cut structure BC_2 does not cut the first stacked structure ST1. The first sub-cut structure BC_1 may be placed on the first cut pattern 133, and the second sub-cut structure BC_2 may be placed on the first connection 131.

The first sub-cut structure BC_1 and the second sub-cut structure BC_2 may be placed alternately in the second direction DR2. For example, the second sub-cut structure BC_2 may be placed between the first sub-cut structures BC_1 adjacent to each other in the second direction DR2, and may be connected to the first sub-cut structures BC_1 adjacent to each other.

Accordingly, the first stacked structure ST1 may include a first stack S1 and a second stack S2 spaced apart from each other by the first sub-cut structure BC_1, and a plurality of first connection stacks CP1 which connects the first stack S1 and the second stack S2. The plurality of first connection stacks CP1 may be spaced from each other in the second direction DR2 between the first stack S1 and the second stack S2.

Additionally, the first supporter layer 130 may be placed on the first stack S1 and the second stack S2, and the first connection 131 may be placed on the first connection stack CP1.

The second stacked structure ST2 may include a third stack S3 and a fourth stack S4 that are spaced apart from each other by a block cut structure BC. The third stack S3 may be placed on the first stack S1, and the fourth stack S4 may be placed on the second stack S2. The third stack S3 and the fourth stack S4 of the second stacked structure ST2 are not connected, e.g. may be divided by the clock cut structure BC.

Further, the second supporter layer 170 may be placed on the third stack S3 and the fourth stack S4, and the second connection 171 may be placed on the block cut structure BC between the third stack S3 and the fourth stack S4.

Each of a width of the lower face of the word line cut structure WLC in the first direction DR1 and a width of the lower face of the block cut structure BC in the first direction DR1 may be less than a width of the upper face of the word line cut structure WLC in the first direction DR1 and a width of the upper face of the block cut structure BC in the first direction DR1. The width of the word line cut structure WLC in the first direction DR1 and the width of the block cut structure BC in the first direction DR1 may increase as they go away from the upper face of the substrate 100; e.g. the word line cut structure WLC and/or the block cut structure BC may have a tapered profile. This may be due to the characteristics of the etching process for forming the word line cut structure WLC and the block cut structure BC.

As the semiconductor memory device becomes highly integrated, in order to individually control the plurality of channel structures CH in a single block, the stacked structures ST1 and ST2 in a single block are cut again by the block cut body BC and may include a plurality of stacks S1, S2, S3, and S4. Additionally or alternatively, a plurality of stacked structures ST1 and ST2 is included in the semiconductor memory device. As a result, as an aspect ratio AR of the non-volatile memory device increases, a leaning phenomenon in which each of or at least one of the stacks S1, S2, S3 and S4 breaks or tilts in one direction may occur.

However, the semiconductor memory device according to some example embodiments may include a first supporter layer 130 which connects the first stack S1 and the second stack S2 on the first stacked structure ST1, and a second supporter layer 170 which connects the third stack S3 and the fourth stack S4 on the second stacked structure ST2. For example, the supporter layers 130 and 170 may be included on each of the stacked structures ST1 and ST2. Accordingly, the leaning phenomenon of the stacks S1, S2, S3 and S4 may be prevented or reduced in likelihood of occurrence, and a non-volatile memory device with improved product reliability may be provided.

Additionally or alternatively, in some example embodiments, a ratio of an area of the first connection 131 to an area of the first supporter layer 130 may be greater than a ratio of an area of the second connection 171 to an area of the second supporter layer 170.

The number of first connections 131 included in the first supporter layer 130 may be greater than the number of second connections 171 included in the second supporter layer 170. For example, the number of the first connections 131 included in the first supporter layer 130 may be n, and the number of the second connections 171 included in the second supporter layer 170 may be m. At this time, n and m are natural numbers, e.g. integers greater than or equal to one, and n may be larger than m. For example, the first connections 131 of the first supporter layer 130 may be arranged more densely than the second connections 171 of the second supporter layer 170.

As a result, the semiconductor memory device according to some example embodiments may more efficiently prevent or reduce the likelihood of the leaning phenomenon of the stacks S1, S2, S3 and S4.

Figure 9:
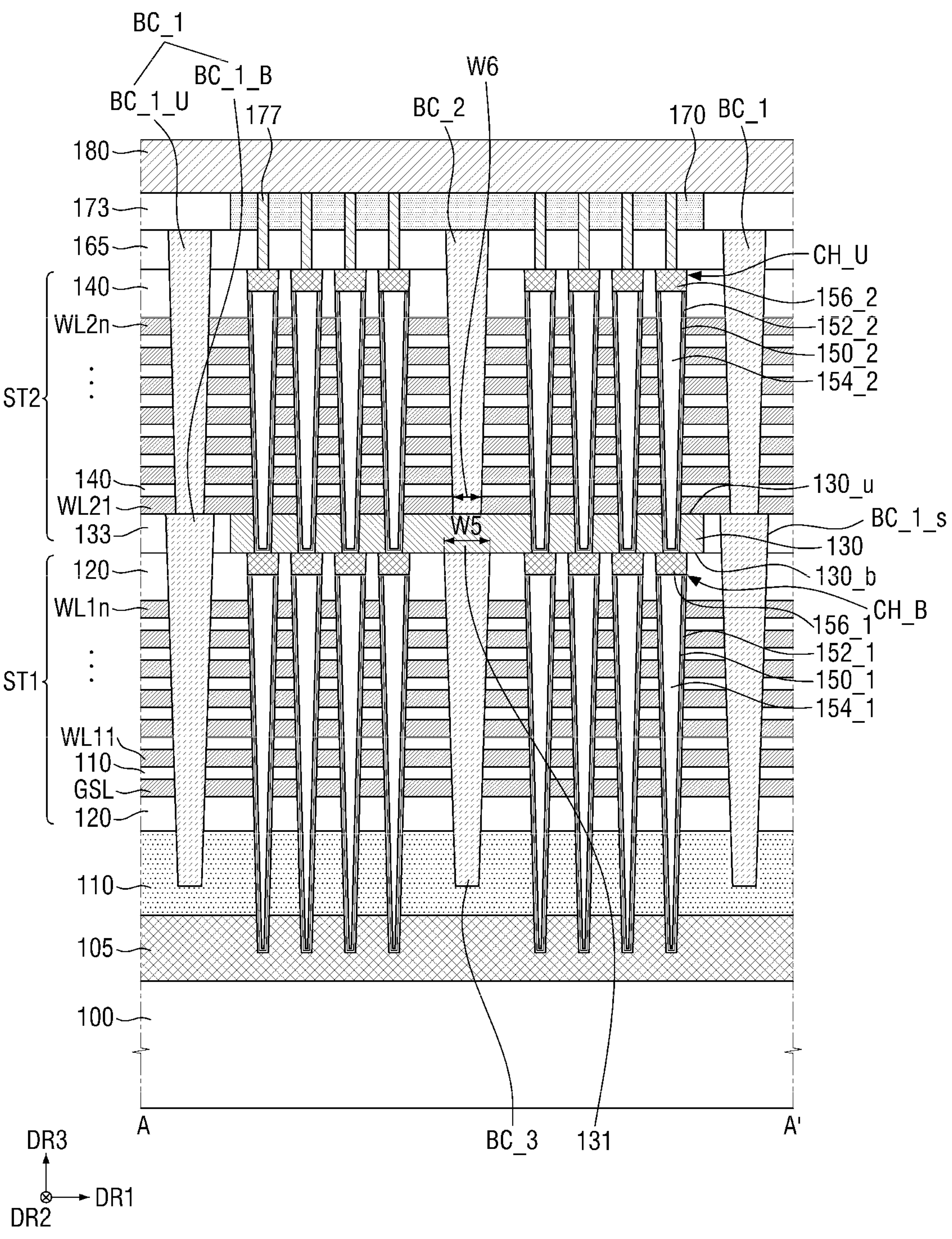
FIG. 9 is a cross-sectional view for explaining a semiconductor memory device according to some example embodiments.

FIG. 9 is a cross-sectional view for explaining the semiconductor memory device according to some example embodiments. FIG. 9 may correspond to a cross-sectional view taken along a line A-A' of FIG. 2. For convenience of explanation, repeated parts of contents explained above using FIGS. 2 to 8 may be briefly explained or omitted.

Referring to FIG. 9, a lower channel structure CH_B and an upper channel structure CH_U of the channel structure CH may be separated.

The lower channel structure CH_B may include a first semiconductor pattern 150_1, a first information storage pattern 152_1, a first filling pattern 154_1, and a first channel pad 156_1. The first semiconductor pattern 150_1 may penetrate the first stacked structure ST1. The first information storage pattern 152_1 may be interposed between the first semiconductor pattern 150_1 and the first gate electrode GSL and WL11 to WL1*n*. The first filling pattern 154_1 may fill the inside of the first semiconductor pattern 150_1. The first channel pad 156_1 may be formed in the first insulating layer 120 placed at the uppermost part of the first stacked structure ST1 and may be formed to be connected to the upper part of the first semiconductor pattern 150_1. The upper face of the first channel pad 156_1 of the lower channel structure CH_B may be placed on the same plane as the lower surface of the first supporter layer 130.

The upper channel structure CH_U may penetrate the second stacked structure ST2 and the first supporter layer 130. The upper channel structure CH_U may include a second semiconductor pattern 150_2, a second information storage pattern 152_2, a second filling pattern 154_2, and a second channel pad 156_2. The second semiconductor pattern 150_2 may penetrate the second stacked structure ST2. The second information storage pattern 152_2 may be interposed between the second semiconductor pattern 150_2 and the second gate electrode GSL and WL11 to WL1*n*. The second filling pattern 154_2 may fill the inside of the second semiconductor pattern 150_2. The second channel pad 156_2 may be formed in the second insulating layer 140 placed at the uppermost part of the second stacked structure ST2, and may be formed connected to the upper part of the second semiconductor pattern 150_2.

The second information storage pattern 152_2 may be placed above the first semiconductor pattern 150_1. The second information storage pattern 152_2 may, for example, partially extend to the inside of the second semiconductor pattern 150_2. As a result, the second information storage pattern 152_2 may be connected/electrically connected to the first semiconductor pattern 150_1.

The first sub-cut structure BC_1 may include a lower sub-cut structure BC_1_B that penetrates the first stacked structure ST1 and the first cut pattern 133, and an upper sub-cut structure BC_1_U that penetrates a second stacked structure ST2 and the first interlayer insulating film 165. In some example embodiments, the lower sub-cut structure BC_1_B and the upper sub-cut structure BC_1_U may be separated. In some example other embodiments, the lower sub-cut structure BC_1_B and the upper sub-cut structure BC_1_U may be directly/connected continuously. For example, the lower sub-cut structure BC_1_B and the upper sub-cut structure BC_1_U may be or correspond to a single body.

A width of the lower face of the lower sub-cut structure BC_1_B in the first direction DR1 may be smaller than a width of the upper face of the lower sub-cut structure BC_1_B in the first direction DR1. The width of the lower sub-cut structure BC_1_B in the first direction DR1 may increase as it goes away from the upper face of the substrate 100. The lower sub-cut structure BC_1_B may have a tapered profile. This may be due to the characteristics of the etching process for forming the lower sub-cut structure BC_1_B.

A width of the lower face of the upper sub-cut structure BC_1_U in the first direction DR1 may be smaller than a width of the upper face of the upper sub-cut structure BC_1_U in the first direction DR1. The width of the upper sub-cut structure BC_1_U in the first direction DR1 may increase as it goes away from the upper face of the substrate 100. The upper sub-cut structure BC_1_U may have a tapered profile. This may be due to the characteristics of the etching process for forming the upper sub-cut structure BC_1_U.

A width W3 of the uppermost face of the lower sub-cut structure BC_1_B in the first direction DR1 may be greater than a width W4 of the lowermost face of the upper channel structure CH_U in the first direction DR1. For example, side walls BC_1_*s* of the first sub-cut structure BC_1 may have a step. For example, the side walls BC_1_*s* of the first sub-cut structure BC_1 may have a step on the upper face of the first connection 131, that is, on the upper face 130*u* of the first supporter layer 130. This may be due to the fact that the etching step of penetrating the first stacked structure ST1 and the etching step of penetrating the second stacked structure ST2 are performed separately, e.g. at separate times and/or within different etch processes/chambers during the fabrication of the semiconductor device.

Also, the side walls BC_1_*s* of the first sub-cut structure BC_1 may have a step at a first level, and the first level may be higher than a second level at which the lower channel structure CH_B and the upper channel structure CH_U are in contact with each other. For example, the side walls BC_1_*s* of the first sub-cut structure BC_1 may have a step above the upper face of the lower channel structure CH_B. Alternatively, the side walls BC_1_*s* of the first sub-cut structure BC_1 may have a step on the upper face 130_*u* of the first supporter layer 130. This may be due to the fact that the steps of forming the first sub-cut structure BC_1 and the second sub-cut structure BC_2 are performed separately, e.g. at separate times and/or within different etch processes/chambers during the fabrication of the semiconductor device.

The block cut structure BC may further include a plurality of third sub-cut structures BC_3 that extends in the second direction DR2 to completely cut the first stacked structure ST1.

A width of the upper face of the third sub-cut structure BC_3 in the first direction DR1 may be smaller than a width of the third sub-cut structure BC_3 in the first direction DR1. The width of the third sub-cut structure BC_3 in the first direction DR1 may increase as it goes away from the upper face of the substrate 100. The third sub-cut structure BC_3 may have a tapered profile. This may be due to the characteristics of the etching process for forming the third sub-cut structure BC_3.

For example, a width W5 of the uppermost face of the third sub-cut structure BC_3 in the first direction DR1 may be greater than a width W6 of the lowermost face of the first sub-cut structure BC_1 in the first direction DR1.

The third sub-cut structure BC_3 may overlap the second sub-cut structure BC_2 in the third direction DR3. The third sub-cut structure BC_3 may be spaced apart from the second sub-cut structure BC_2 in the third direction DR3. The uppermost face of the third sub-cut structure BC_3 may be in contact with the lower face 130_*b* of the first supporter layer 130. The lowermost face of the second sub-cut structure BC_2 may be in contact with/direct contact with the upper face 130_*u* of the first supporter layer 130.

As a result, the first stacked structure ST1 may include a first stack S1 and a second stack S2 which are spaced apart from each other by the first sub-cut structure BC_1 and the third sub-cut structure BC_3. The first stacked structure ST1 does not include a connection stack. As a result, the channel structures CS can be more easily/more likely/more efficiently controlled individually. Alternatively or additionally, because the semiconductor memory device according to some example embodiments includes the first supporter layer 130 which connects the first stack S1 and the second stack S2, even if the first stack S1 and the second stack S2 are completely separated, e.g. electrically isolated from one another, the leaning phenomenon of the stacks S1, S2, S3 and S4 can be prevented or reduced in likelihood of occurrence.

Figure 10:
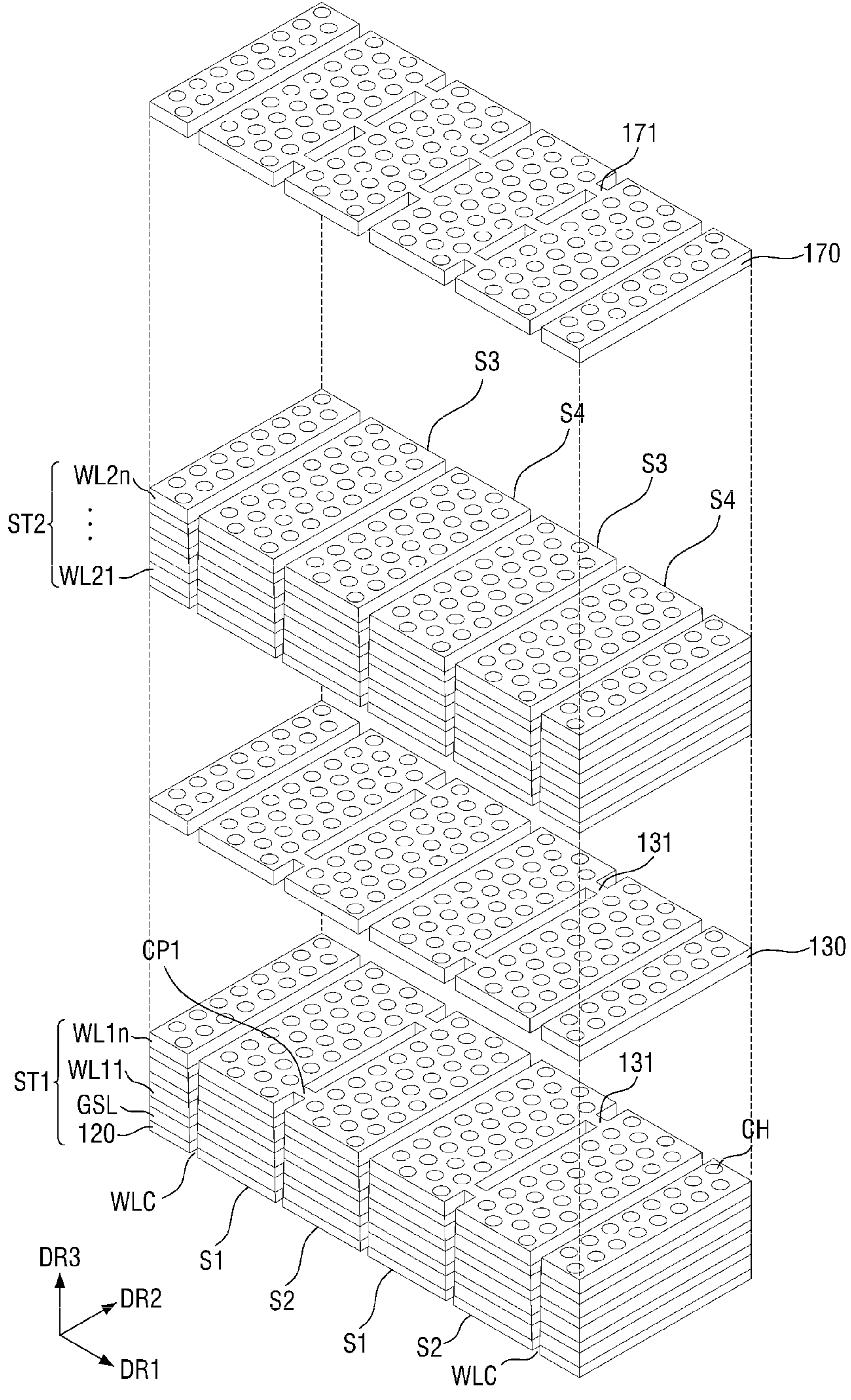
FIG. 10 is a partially exploded schematic perspective view for explaining the semiconductor memory device according to some example embodiments.
Figure 11A:
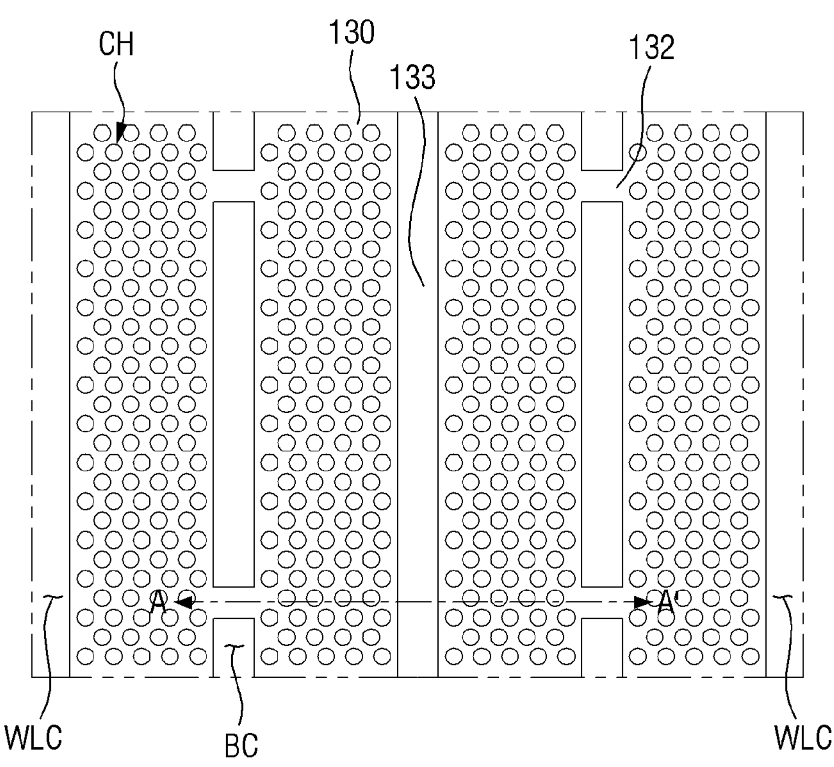
FIG. 11A is a layout diagram of a first supporter layer of FIG. 10.
Figure 11A:
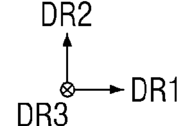
Figure 11B:
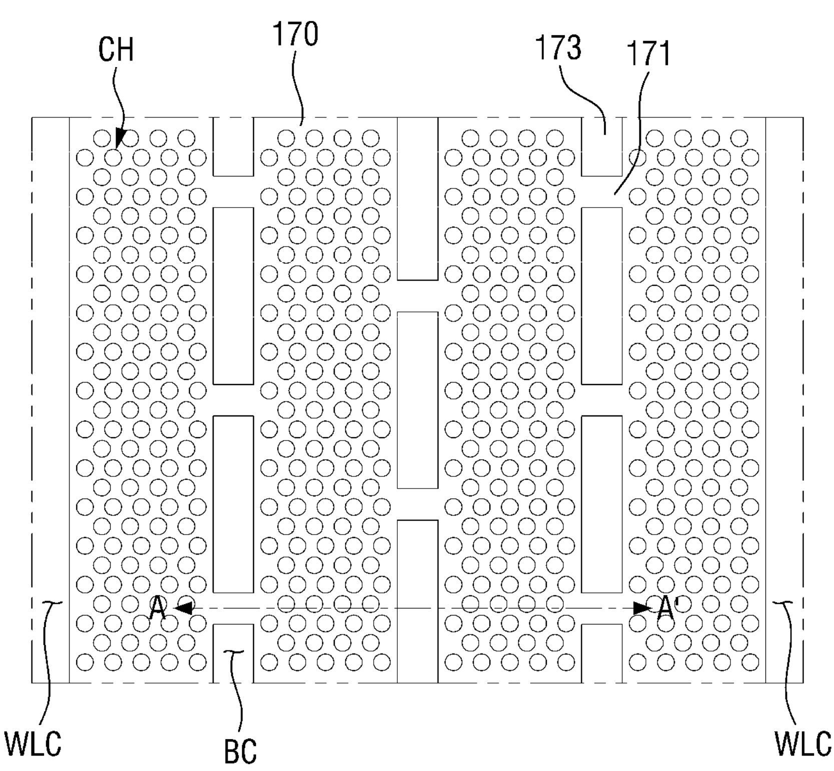
FIG. 11B is a layout diagram of a second supporter layer of FIG. 10.
Figure 11B:
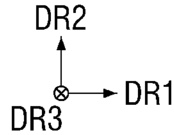

FIG. 10 is a partially exploded schematic perspective view for explaining a semiconductor memory device according to some example embodiments. FIG. 11A is a layout diagram of the first supporter layer of FIG. 10. FIG. 11B is a layout diagram of the second supporter layer of FIG. 10. For convenience of explanation, repeated parts of contents explained above using FIGS. 2 to 9 will be briefly explained or omitted.

Referring to FIGS. 10, 11A, and 11B, in some example embodiments, a ratio of the area of the first connection 131 to the area of the first supporter layer 130 may be less than a ratio of the area of the second connection 171 to the area of the second supporter layer 170.

The number of first connections 131 included in the first supporter layer 130 may be less than the number of second connections 171 included in the second supporter layer 170. For example, the number of the first connections 131 included in the first supporter layer 130 may be n, and the number of the second connections 171 included in the second supporter layer 170 may be m. At this time, n and m integers greater than or equal to one, and n may be smaller than m. For example, the second connections 171 of the second supporter layer 170 may be placed more densely than the first connections 131 of the first supporter layer 130.

The block cut structure BC may include, for example, a first sub-cut structure BC_1 and a second sub-cut structure BC_2, as explained using FIGS. 2 to 8. In this case, as explained using FIGS. 2 to 8, the lower channel structure CH_B and the upper channel structure CH_U of the channel structure CS may be a single body, e.g. may be integrally formed.

According to some example embodiments, the block cut structure BC may further include a third sub-cut structure BC_3, as explained using FIG. 9. In this case, as explained using FIG. 9, the lower channel structure CH_B and the upper channel structure CH_U of the channel structure CH may be separated.

Figure 12:
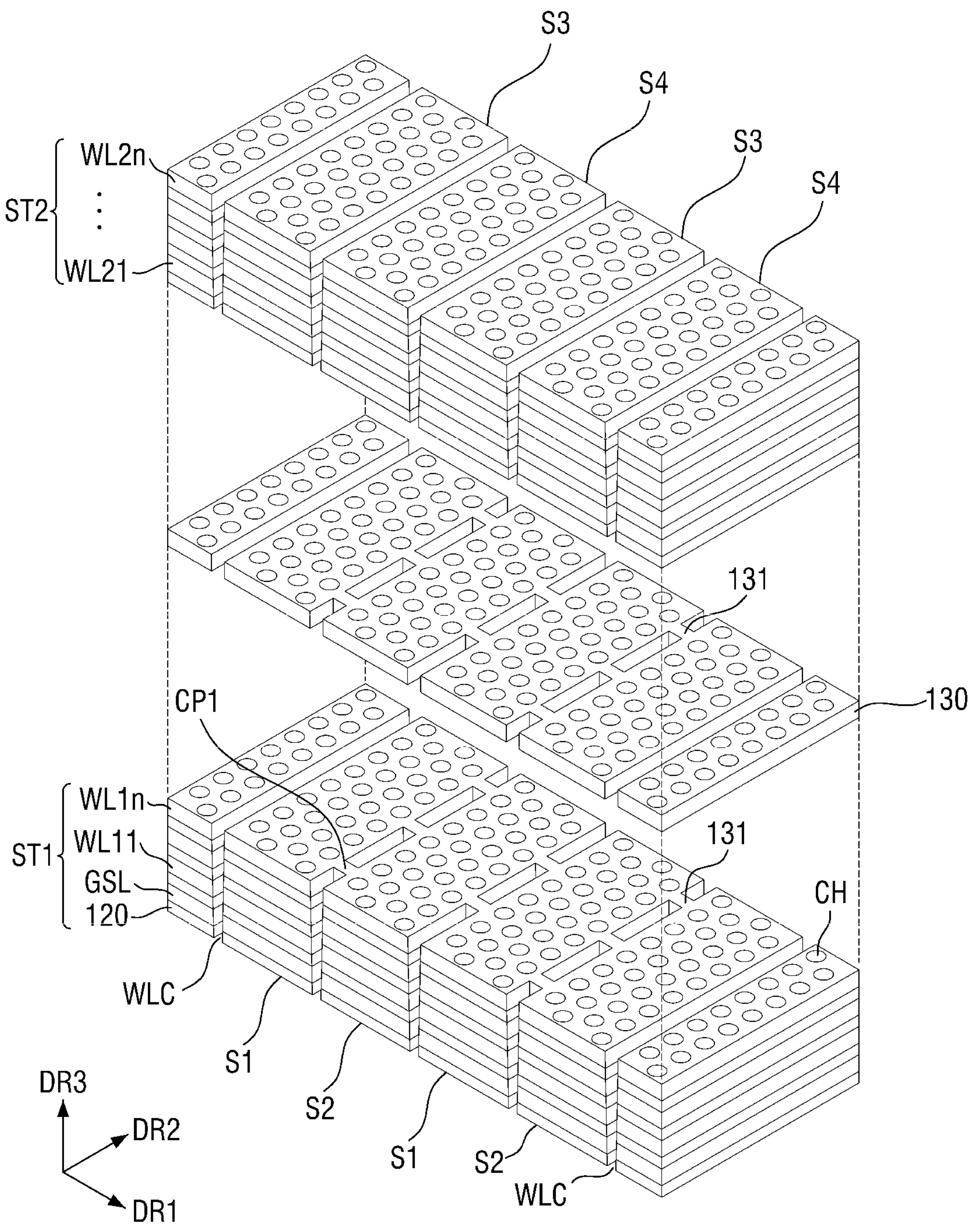
FIG. 12 is a partially exploded schematic perspective view for explaining the semiconductor memory device according to some example embodiments.
Figure 13:
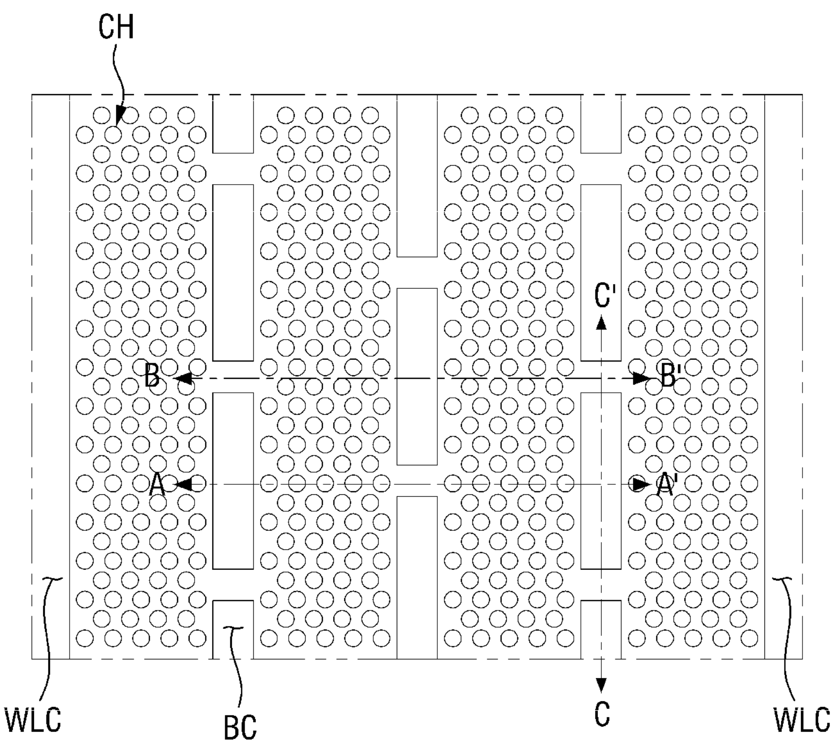
FIG. 13 is a layout diagram of the first supporter layer of FIG. 12.
Figure 13:
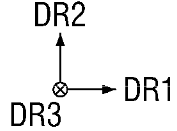
Figure 14:
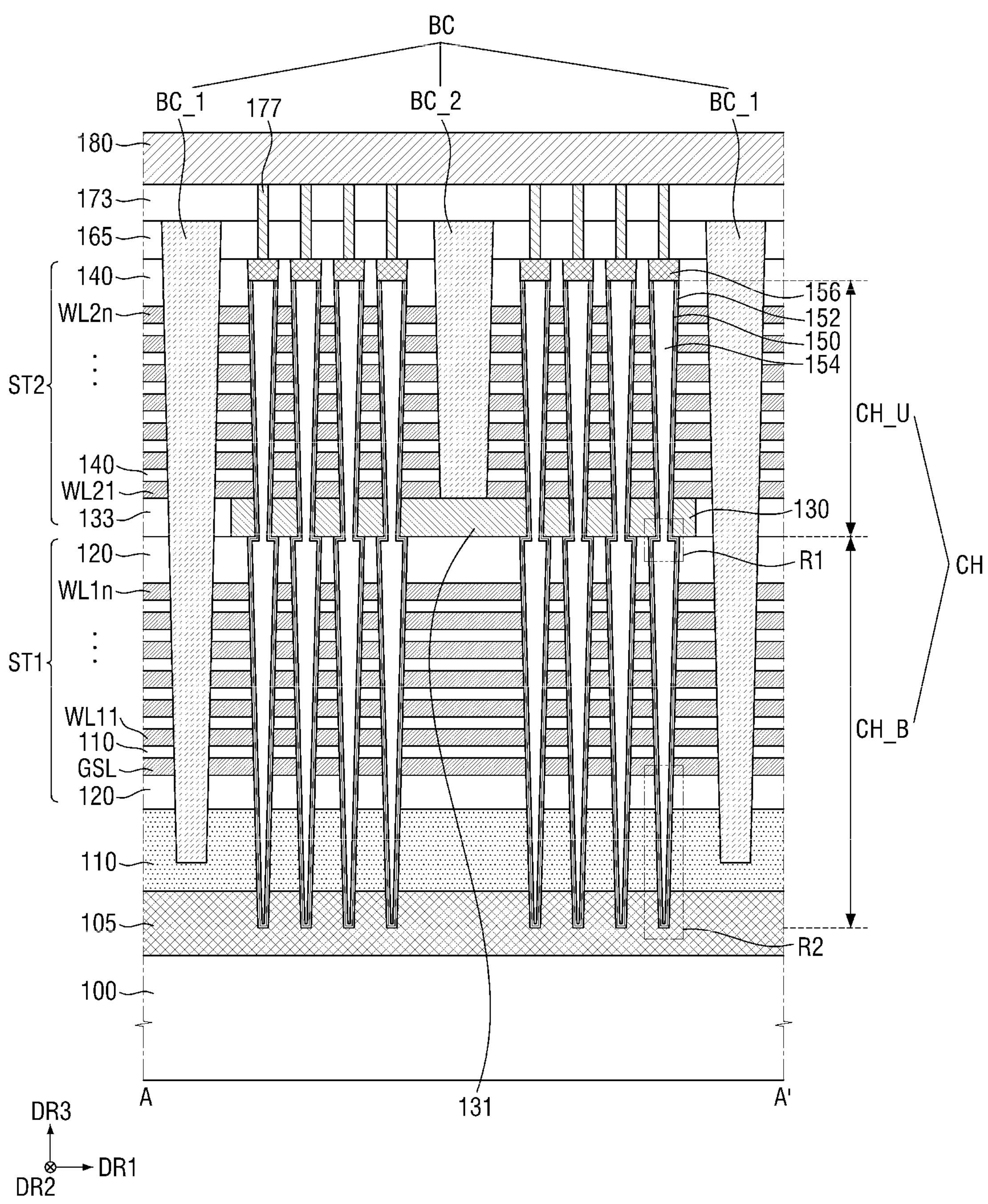
FIG. 14 is a cross-sectional view taken along a line A-A' of FIG. 13.

FIG. 12 is a partially exploded schematic perspective view for explaining the semiconductor memory device according to some example embodiments. FIG. 13 is a layout diagram of the first supporter layer of FIG. 12. FIG. 14 is a cross-sectional view taken along a line A-A' of FIG. 12. For convenience of explanation, repeated parts of contents explained above using FIGS. 2 to 9 will be briefly explained or omitted.

Referring to FIGS. 12 to 14, in some example embodiments, the semiconductor memory device may include a first supporter layer 130 without a second supporter layer 170.

The first interlayer insulating film 165 and the second interlayer insulating film 175 may be sequentially placed on the second stacked structure ST2. The first interlayer insulating film 165 and the second interlayer insulating film 175 may include, for example, but are not limited to, silicon oxide.

The bit line BL may be connected to the plurality of channel structures CH through the bit line contact 177. The bit line contact 177 may, for example, penetrate the first interlayer insulating film 165 and the second interlayer insulating film 175 to electrically connect the bit line 180 and the channel structure CH.

Figure 15:
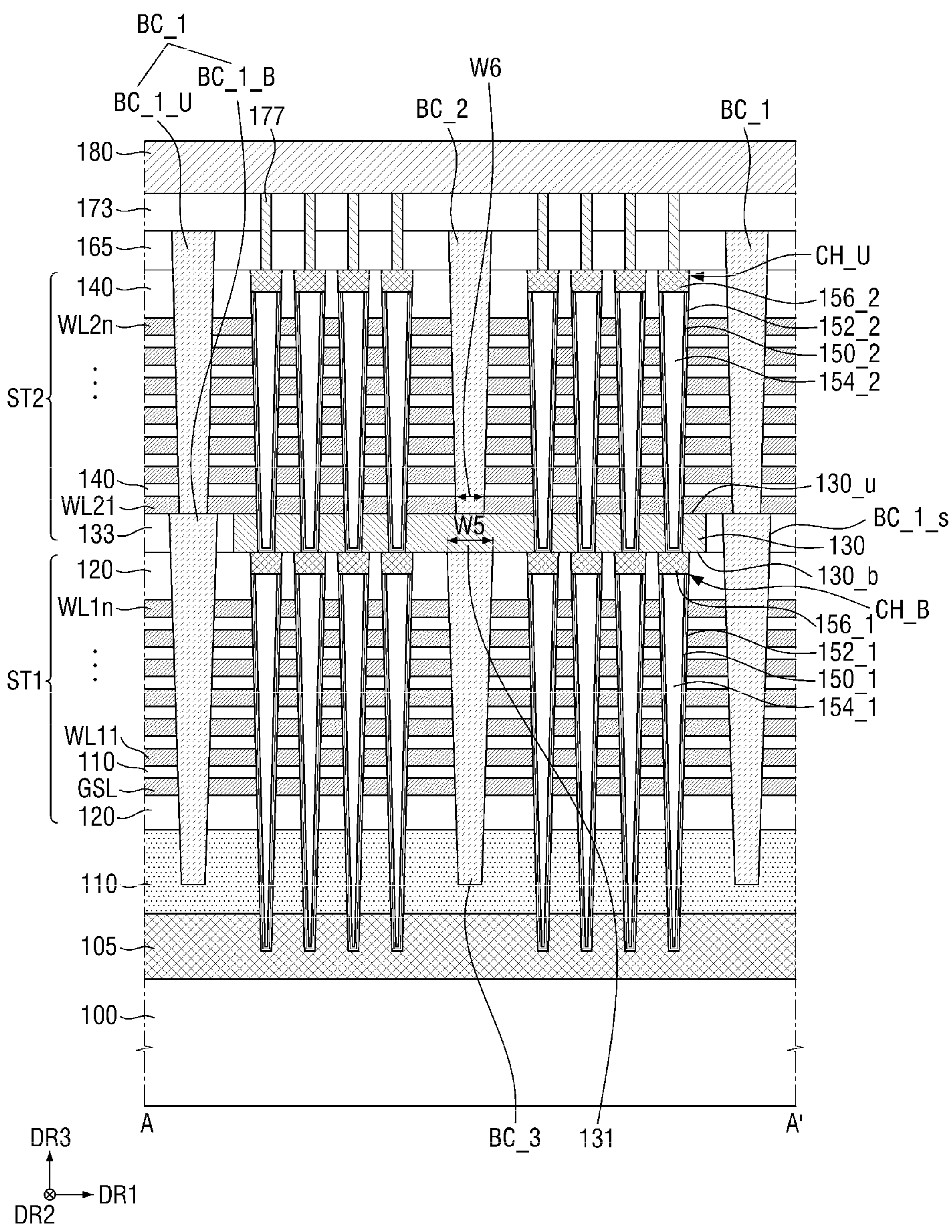
FIG. 15 is a cross-sectional view for explaining the semiconductor memory device according to some example embodiments.

FIG. 15 is a cross-sectional view for explaining a semiconductor memory device according to some example embodiments. FIG. 15 may correspond to a cross-sectional view taken along a line A-A' of FIG. 13. For convenience of explanation, repeated parts of contents explained above using FIGS. 12 to 14 will be briefly explained or omitted.

Referring to FIG. 15, as explained using FIG. 9, the block cut structure BC may further include a third sub-cut structure BC_3. Accordingly, as explained using FIG. 9, the lower channel structure CH_B and the upper channel structure CH_U of the channel structure CH may be separated/electrically separated.

Figure 16:
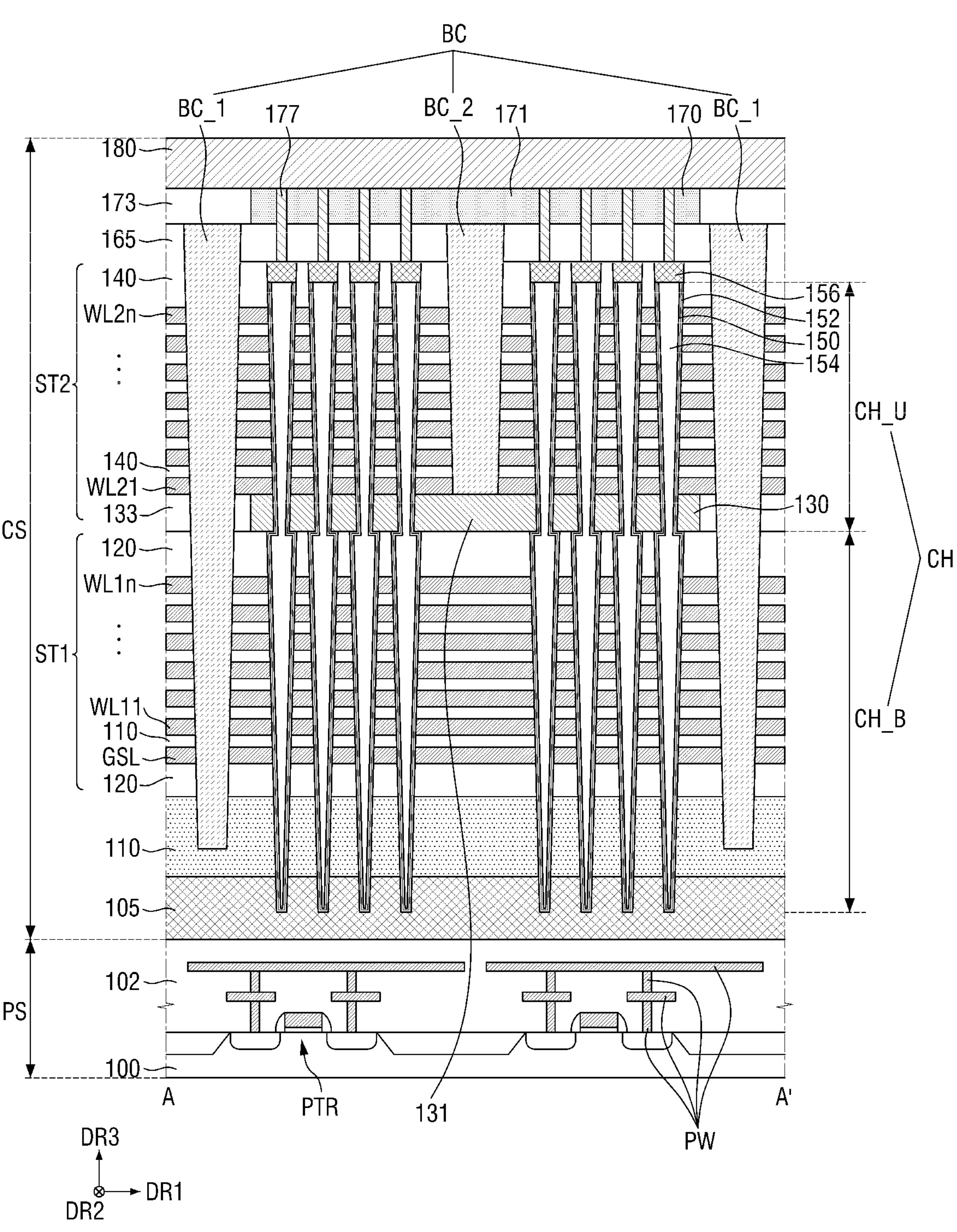
FIG. 16 is a cross-sectional view for explaining the semiconductor memory device according to some example embodiments.

FIG. 16 is a cross-sectional view for explaining a semiconductor memory device according to some example embodiments. FIG. 16 may correspond to a cross-sectional view taken along the line A-A' of FIG. 2. For convenience of explanation, repeated parts of contents explained above using FIGS. 1 to 9 will be briefly explained or omitted.

Referring to FIG. 16, the semiconductor memory device according to some example embodiments may include a peripheral circuit structure PS and a cell array structure CS.

The peripheral circuit structure PS may include a peripheral circuit element PTR, a lower connection wiring body PW, and a peripheral logic insulating film 102.

The peripheral circuit element PTR may be formed on the substrate 100. The peripheral circuit element PTR may be circuits such as transistors/logic gates/diodes/combinatorial logic units that operate the cell array structure CS.

The peripheral logic insulating film 102 may be formed on the substrate 100. The peripheral logic insulating film 102 may include, for example, at least one of silicon oxide, silicon nitride, silicon oxynitride and a low-dielectric constant material.

The lower connection wiring body PW may be formed in the peripheral logic insulating film 102. The lower connection wiring body PW may be connected to the peripheral circuit element PTR.

The cell array structure CS may be placed on the peripheral logic structure PS. The cell array structure CS may include a substrate 100, a common source plate 105, a support semiconductor layer 110, a first stacked structure ST1, a first supporter layer 130, a second stacked structure ST2, a channel structure CH, a second supporter layer 170 and a bit line BL. The common source plate 105 may extend along the upper face of the peripheral logic structure PS.

Figure 17:
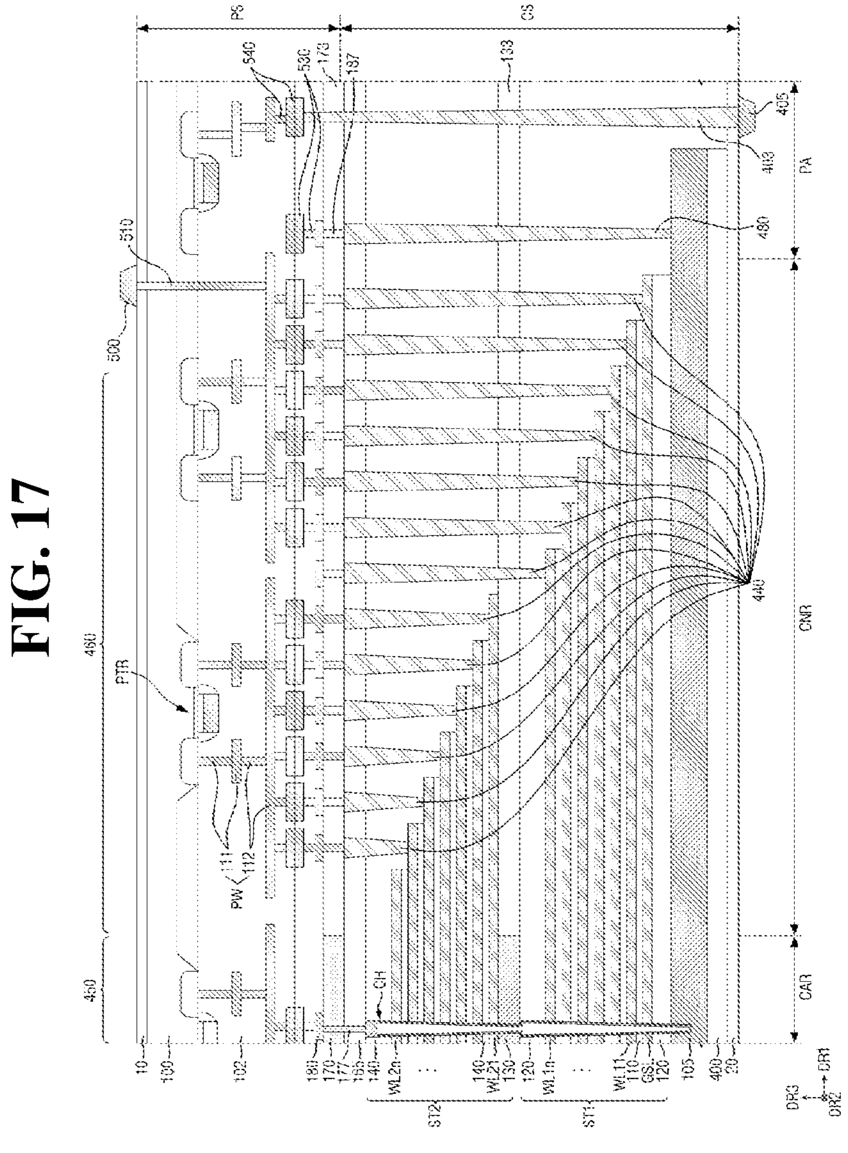
FIG. 17 is a diagram for explaining a semiconductor memory device according to some example embodiments.

FIG. 17 is a diagram for explaining a semiconductor memory device according to some example embodiments. For convenience of explanation, repeated parts of contents explained above using FIGS. 1 to 9 will be briefly explained or omitted.

Referring to FIG. 17, the semiconductor memory device may have a C2C (chip to chip) structure. The C2C structure may mean or correspond to a structure in which an upper chip including the cell array structure CS is fabricated on a first wafer, a lower chip including the peripheral circuit structure PS is fabricated on a second wafer different from the first wafer, and then, the upper chip and the lower chip are connected to each other by a bonding way. As an example, the bonding way may mean or refer to electrically connecting a bonding metal formed on the uppermost metal layer of the upper chip and a bonding metal formed on the uppermost metal layer of the lower chip to each other. For example, when the bonding metal is formed of copper (Cu), the bonding way may be a Cu—Cu bonding way, and the bonding metal may also be formed of aluminum or tungsten.

Each of the peripheral circuit structure PS and the cell array structure CS of the semiconductor memory device may include an external pad bonding region PA, a cell region CAR, and a cell region CAR.

The peripheral circuit structure PS may include a first substrate 100, a peripheral logic insulating film 102, a plurality of circuit elements PTR formed on the first substrate 100, and a lower connection wiring body PW connected to each of the plurality of circuit elements PTR. In some example embodiments, the first metal layer 111 may be made of tungsten, which has a relatively high resistance, and the second metal layer 112 may be made of copper, which has a relatively low resistance.

Although only the first metal layer 111 and the second metal layer 112 are shown and explained, example embodiments are not limited thereto, and at least one or more metal layers may be further formed on the second metal layer 112. At least a part of one or more metal layers formed above the second metal layer 112 may be formed of aluminum or the like having a resistance lower than that of copper which forms the second metal layer 112.

The peripheral logic insulating film 102 is placed on the first substrate 100 to cover the plurality of circuit elements PTR, the first metal layer 111, and the second metal layer 112, and may include an insulating material such as silicon oxide and/or silicon nitride.

A lower bonding metal 540 may be formed on the second metal layer 112 of the cell region CAR. In the cell region CAR, the lower bonding metal 540 of the peripheral circuit structure PS may be electrically connected to the upper bonding metal 530 of the cell array structure CS by a bonding way. The lower bonding metal 540 and the upper bonding metal 530 may be formed of at least one of aluminum, copper, tungsten, or the like.

The cell array structure CS may provide at least one memory block. The cell array structure CS may include a second substrate 400 and a common source plate 105. A plurality of gate electrodes GSL, WL11 to WL1*n*, and WL21 to WL2*n* may be stacked on the second substrate 400 along a direction (a Z-axis direction) perpendicular to the upper face of the second substrate 400. String selection lines and a ground selection line may be placed at the upper part and the lower part of the gate electrodes GSL, WL11 to WL1*n*, and WL21 to WL2*n*, respectively, and a plurality of gate electrodes GSL, WL11 to WL1*n*, and WL21 to WL2*n* may be placed between the string selection lines and the ground selection line.

In the cell region CAR, the channel structure CH may extend in the direction perpendicular to the upper face of the second substrate 400, and may penetrate the gate electrodes GSL and WL11 to WL1*n*, and WL21 to WL2*n*, the string selection lines, and the ground selection line. The channel structure CH may include a data storage layer, a channel layer, a buried insulating layer, and the like, and the channel layer may be electrically connected to the first metal layer 350*c* and the second metal layer 360*c*. For example, the first metal layer 350*c* may be a bit line contact, and the second metal layer 360*c* may be a bit line. In some example embodiments, the bit line 180 may extend along a first direction DR1 parallel to the upper face of the second substrate 400.

In some example embodiments as shown in FIG. 17, a region in which the channel structure CH, the bit line 180 and the like are placed may be defined as the cell region CAR. The bit line 180 may be connected/electrically connected to the circuit elements PTR that provide a page buffer 450 in the peripheral circuit structure PS in the cell region CAR. As an example, the bit line 180 is connected to the upper bonding metal 530 in the peripheral circuit structure PS, and the upper bonding metal 530 may be connected to the lower bonding metal 540 connected to the circuit elements PTR of the page buffer 450.

In the cell region CAR, the gate electrodes GSL and WL11 to WL1*n*, and WL21 to WL2*n* may extend along a third direction DR3 parallel to the upper face of the second substrate 400, and may be connected to a plurality of cell contact plugs 440. The gate electrodes GSL, WL11 to WL1*n*, and WL21 to WL2*n*, and the cell contact plugs 440 may be connected to each other with pads provided by at least some examples of the gate electrodes GSL, WL11 to WL1*n*, and WL21 to WL2*n* extending along the second direction at different lengths from each other. A first metal layer 350*b* and a second metal layer 360*b* may be connected sequentially to the upper parts of the cell contact plug 440 connected to the gate electrodes GSL, WL11 to WL1*n*, and WL21 to WL2*n*. The cell contact plugs 440 may be connected to the peripheral circuit structure PS through the upper bonding metal 530 of the cell array structure CS and the lower bonding metal 540 of the peripheral circuit structure PS in the cell region CAR.

The cell contact plugs 440 may be connected/electrically connected to the circuit elements PTR that provide a row decoder 460 in the peripheral circuit structure PS. In some example embodiments, an operating voltage of the circuit elements PTR that provide the row decoder 460 may differ from an operating voltage of the circuit elements PTR that provide the page buffer 450. As an example, the operating voltage of the circuit elements PTR that provide the page buffer 450 may be higher than the operating voltage of the circuit elements PTR that provide the row decoder 460.

A common source line contact plug 480 may be placed in the external pad bonding region PA. The common source line contact plug 480 may be formed of a conductive material such as at least one of a metal, metal compound or doped or undoped polysilicon, and may be electrically connected to the common source plate 105. A metal layer 187 may be placed above the common source line contact plug 480. As an example, the region in which the common source line contact plug 480 and metal layer 187 are placed may be defined as the external pad bonding region PA.

Alternatively, I/O pads 405 and 500 may be placed in the external pad bonding region PA. Referring to FIG. 17, a lower insulating film 10 that covers the lower face of the first substrate 100 may be formed below the first substrate 100. A first I/O pad 500 may be formed on the lower insulating film 10. The first I/O pad 500 is connected to at least one of a plurality of circuit elements PTR placed in the peripheral circuit structure PS through the first I/O contact plug 510, and may be separated from the first substrate 100 by the lower insulating film 10. Further, a side insulating film may be placed between the first I/O contact plug 510 and the first substrate 100 to electrically separate the first I/O contact plug 510 and the first substrate 100.

Still referring to FIG. 17, an upper insulating film 20 that covers the upper face of the second substrate 400 may be formed above the second substrate 400, and a second I/O pad 405 may be placed on the upper insulating film 20. The second I/O pad 405 may be connected to at least one of a plurality of circuit elements PTR placed in the peripheral circuit structure PS through the second I/O contact plug 403.

According to some example embodiments, the second substrate 400 and the common source plate 105 may not be placed in the region in which the second I/O contact plug 403 is placed. Also, the second I/O pad 405 may not overlap the gate electrodes GSL, WL11 to WL1*n*, and WL21 to WL2*n* in the second direction DR2. Referring to FIG. 17, the second I/O contact plug 403 is separated from the second substrate 400 in a direction parallel to the upper face of the second substrate 400, penetrates the first insulating layer 120, the first cut pattern 133 and the second insulating layer 140 of the cell array structure CS, and may be connected to the second I/O pad 405.

According to some example embodiments, the first I/O pad 500 and the second I/O pad 405 may be selectively formed. As an example, the semiconductor memory device includes only the first I/O pad 500 placed on the first substrate 100, or may include only a second I/O pad 405 placed on the second substrate 400. Alternatively or additionally, the semiconductor memory device may include both the first I/O pad 500 and the second I/O pad 405.

In each of the external pad bonding region PA and the cell region CAR included in the cell array structure CS and the peripheral circuit structure PS, a metal pattern of the uppermost metal layer may exist as a dummy pattern, or the uppermost metal layer may be empty.

The semiconductor memory device may form a lower bonding metal 540 having the same shape as the upper bonding metal 530 of the cell array structure CS on the uppermost metal layer of the peripheral circuit structure PS to correspond to the upper bonding metal 530 formed on the uppermost metal layer of the cell array structure CS in the external pad bonding region PA. The lower bonding metal 540 formed on the uppermost metal layer of the peripheral circuit structure PS may not be connected to a separate contact in the peripheral circuit structure PS. Similarly, an upper metal pattern having the same shape as the lower bonding metal PS of the peripheral circuit structure may be formed on the upper metal layer of the cell array structure CS to correspond to the lower bonding metal formed on the uppermost metal layer of the peripheral circuit structure PS in the external pad bonding region PA.

The lower bonding metal 540 may be formed on the second metal layer 112 of the cell region CAR. In the cell region CAR, the lower bonding metal 540 of the peripheral circuit structure PS may be electrically connected to the upper bonding metal 530 of the cell array structure CS by the bonding way.

Additionally, in the cell region CAR, the upper bonding metal 530 having the same shape as the lower bonding metal 540 of the peripheral circuit structure PS may be formed on the uppermost metal layer of the cell array structure CS to correspond to the lower bonding metal 540 formed on the uppermost metal layer of the peripheral circuit structure PS. No contact may be formed on the upper bonding metal 530 formed on the uppermost metal layer of the cell array structure CS.

Figure 18:
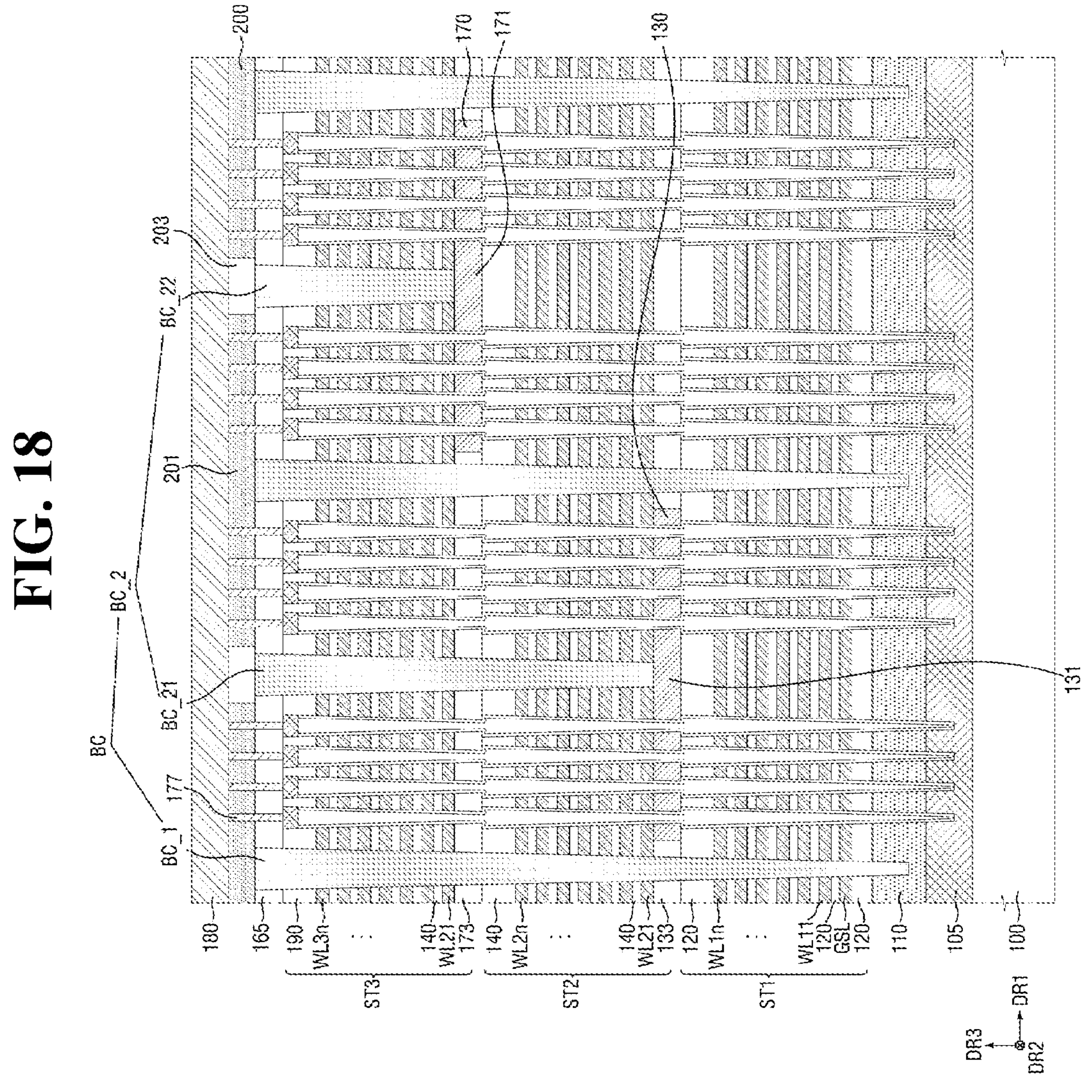
FIG. 18 is a diagram for explaining the semiconductor memory device according to some example embodiments.

FIG. 18 is a diagram for explaining a semiconductor memory device according to some example embodiments. For convenience of explanation, repeated parts of contents explained above using FIGS. 1 to 9 will be briefly explained or omitted in FIG. 18.

Referring to FIG. 18, the semiconductor memory device according to some example embodiments may further include a third stacked structure ST3 and a third supporter layer 200.

The third stacked structure ST3 may be placed on the second supporter layer 170. The third stacked structure ST3 may include a plurality of third gate electrodes WL31 to WL3*n* and a plurality of third insulating layers 190 which are alternately stacked on the second supporter layer 170. For example, each of the third gate electrodes WL31 to WL3*n* and each of the third insulating layers 190 may have a layered structure extending in the first direction DR1 and the second direction DR2.

In some example embodiments, the string selection line SSL may be a gate electrode located at the uppermost part among a plurality of third gate electrodes WL31 to WL3*n*.

The first stacked structure ST1, the second stacked structure ST2 and the third stacked structure ST3 may be completely cut by the word line cut structure WLC.

The first interlayer insulating film 165 and the third supporter layer 200 may be sequentially placed on the third stacked structure ST3. The second supporter layer 170 may be separated by a plurality of third cut patterns 203 extending in the second direction DR2. Additionally, the plurality of third cut patterns 203 may be spaced apart from each other in the first direction DR1. Therefore, the third supporter layer 200 may be spaced apart from each other in the first direction DR1.

Each third cut pattern 203 may include a plurality of third connections 202. The plurality of third connections 202 may be spaced apart from each other in the second direction DR2 inside each of the third cut patterns 203. The plurality of third connections 202 may be connected/directly connected to the third supporter layer 200. For example, the third supporter layers 200 spaced apart from each other in the first direction DR1 may be connected to each other by the plurality of third connections 202.

The number of plurality of third connections 202 included in each third cut pattern 203 may be different for each of the third cut patterns 203. Further, the arrangement of the plurality of third connections 202 included in each of the third cut patterns 203 may also be different for each of the third cut patterns 203.

The first supporter layer 130 and the first connection 131 may include the same materials as the second supporter layer 170 and the second connection 171. The first supporter layer 130, the first connection 131, the second supporter layer 170 and the second connection 171 may include, for example, materials having a higher etching selectivity than silicon oxide and silicon nitride. The first supporter layer 130, the first connection 131, the second supporter layer 170 and the second connection 171 may include, but are not limited to polysilicon including aluminum oxide (ALO), metallic materials or impurities.

The third supporter layer 200 and the third connection 202 may include the same material. The third supporter layer 200 and the third connection 202 may include materials different from the first supporter layer 130, the first connection 131, the second supporter layer 170, and the second connection 171. The third supporter layer 200 and the third connection 202 may include, for example, oxides such as silicon oxide.

The first cut pattern 133, the second cut pattern 173, and the third cut pattern 203 may include, for example, but are not limited to, silicon oxide.

The block cut structure BC may include a first sub-cut structure BC_1 and a second sub-cut structure BC_2.

The first sub-cut structure BC_1 may completely cut the first stacked structure ST1, the second stacked structure ST2, and the third stacked structure ST3. The first sub-cut structure BC_1 may penetrate the first cut pattern 133, the second cut pattern 1723 and the third cut pattern 203.

A bottom face of the second sub-cut structure BC_2 may be placed on the same plane as the upper face of the connection placed at the uppermost part among the first connection 131 and the second connection 171 overlapping in the third direction DR3.

The second sub-cut structure BC_2 does not cut the first stacked structure ST1. The second sub-cut structure BC_2 may include a second-1 sub-cut structure BC_21 which cuts only the third stacked structure ST3 and the second stacked structure ST2, and a second-2 sub-cut structure BC_22 that cuts only the third stacked structure ST3. The second-1 sub-cut structure BC_21 may be placed on the first connection 131, and the second-2 sub-cut structure BC_22 may be placed on the second connection 171.

As a result, the third stacked structure ST3 may be divided into a plurality of stacks by the block cut structure BC. Also, the first stacked structure ST1 and the second stacked structure ST2 are not cut by the second sub-cut structure BC_2 and include a formed connection stack. On the other hand, the third stacked structure ST3 is completely separated by the block cut structure BC, and therefore does not include a connection stack.

Each of the third cut patterns 203 may overlap the respective first cut patterns 133 and second cut patterns 173 in the third direction DR3.

Therefore, the plurality of stacks of the third stacked structure ST3 may be placed on the plurality of stacks of the first stacked structure ST1 and the plurality of stacks of the second stacked structure ST2. The third connection 201 of the third supporter layer 200 may connect a plurality of stacks of the third stacked structure ST3.

In some example embodiments, at least one of the ratio of the area of the first connection 131 to the area of the first supporter layer 130, the ratio of the area of the second connection 171 to the area of the second supporter layer 170, and the ratio of the area of the third connection 202 to the area of the third supporter layer 200 may be different from each other. At least one of the number of first connections 131 included in the first supporter layer 130, the number of second connections 171 included in the second supporter layer 170, and the number of third supporter layers 200 included in the third connection 202 may be different from each other. For example, the number of third connections 202 may be greater than the number of second connections 171, and the number of second connections 171 may be greater than the number of first connections 131. In another example, the number of third connections 202 may be smaller than the number of second connections 171, and the number of second connections 171 may be smaller than the number of first connections 131. In still another example, the number of second connections 171 may be greater than the number of first connections 131 and third connections 202.

Figure 19:
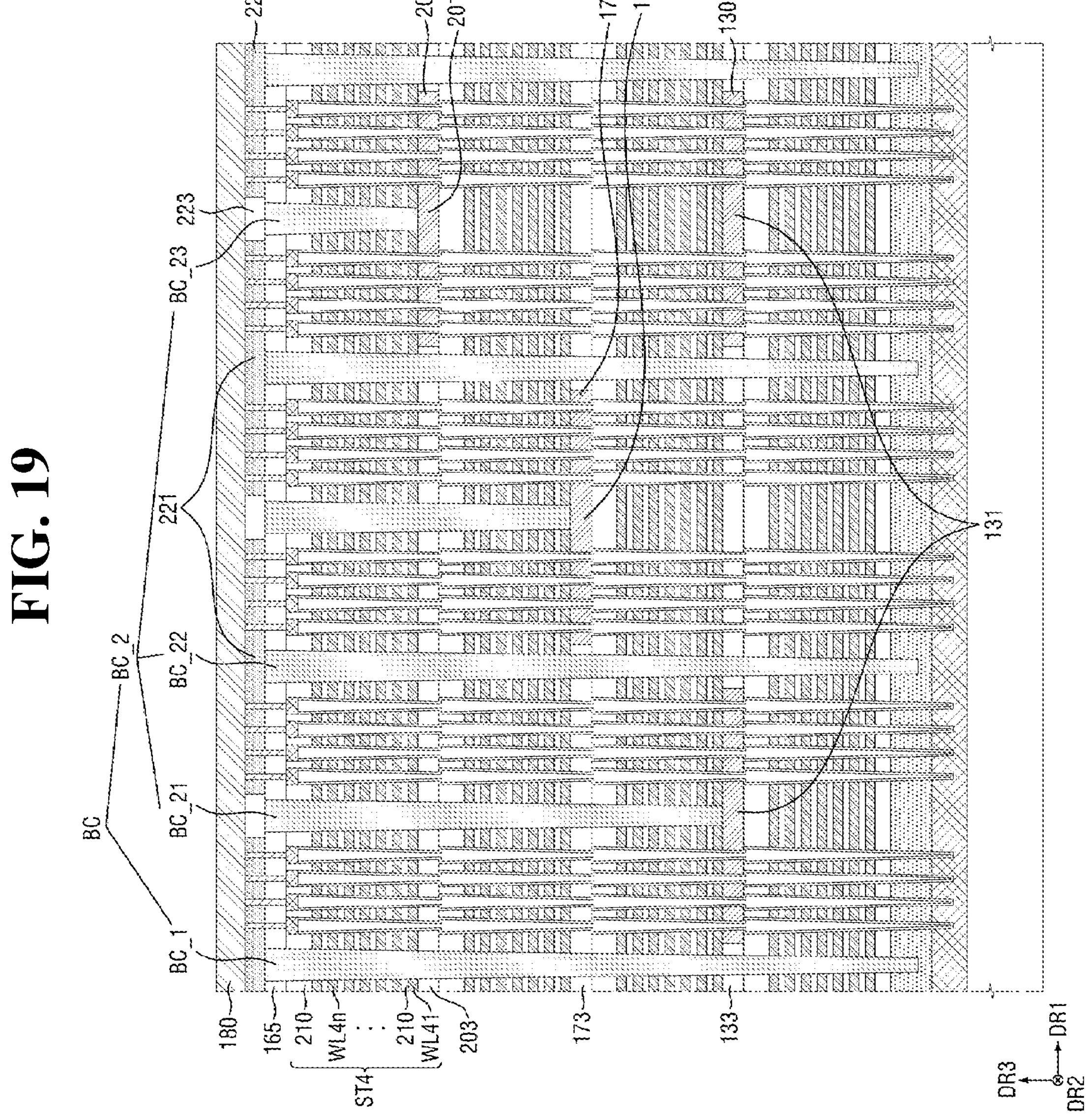
FIG. 19 is a diagram for explaining a semiconductor memory device according to some example embodiments.

FIG. 19 is a diagram for explaining a semiconductor memory device according to some example embodiments. For convenience of explanation, repeated parts of contents explained above using FIGS. 1 to 9 and 18 will be briefly explained or omitted in FIG. 19.

Referring to FIG. 19, the semiconductor memory device according to some example embodiments may further include a fourth stacked structure ST4 and a fourth supporter layer 220.

The fourth stacked structure ST4 may be placed on the third supporter layer 200. The fourth stacked structure ST4 may include a plurality of fourth gate electrodes WL41 to WL4*n* and a plurality of fourth insulating layers 210 which are alternately stacked on the third supporter layer 200. For example, each of the fourth gate electrodes WL41 to WL4*n* and each of the fourth insulating layers 210 may have a layered structure extending in the first direction DR1 and the second direction DR2.

In some example embodiments, the string selection line SSL may be a gate electrode located at the uppermost part among the plurality of fourth gate electrodes WL41 to WL4*n*.

The first stacked structure ST1, the second stacked structure ST2, the third stacked structure ST3 and the fourth stacked structure ST4 may be completely cut by the word line cut structure WLC.

The first interlayer insulating film 165 and the fourth supporter layer 220 may be sequentially placed on the fourth stacked structure ST4. The fourth supporter layer 220 may be separated by a plurality of fourth cut patterns 223 extending in the second direction DR2. Also, the plurality of fourth cut patterns 223 may be spaced part from each other in the first direction DR1. Therefore, the fourth supporter layers 220 may be spaced part from each other in the first direction DR1.

Each fourth cut pattern 223 may include a plurality of fourth connections 222. The plurality of fourth connections 222 may be spaced part from each other in the second direction DR2 inside each of the fourth cut patterns 223. The plurality of fourth connections 222 may be connected to the fourth supporter layer 220. For example, the fourth supporter layers 220 spaced apart from each other in the first direction DR1 may be connected to each other by the plurality of fourth connections 222.

The number of plurality of fourth connections 222 included in each fourth cut pattern 223 may be different for each of the fourth cut patterns 223. Further, the arrangement of the plurality of fourth connections 222 included in each of the fourth cut patterns 223 may also be different for each of the fourth cut patterns 223.

The first supporter layer 130, the second supporter layer 170, and the third supporter layer 200 may include, for example, a material having a higher etching selectivity than silicon oxide and silicon nitride. The first supporter layer 130, the second supporter layer 170 and the third supporter layer 200 may include, for example, but are limited thereto, polysilicon including ALO, metallic materials or impurities.

The fourth supporter layer 220 and a fourth connection 221 may include the same material. The fourth supporter layer 220 may include, for example, oxides such as silicon oxide.

The first cut pattern 133, the second cut pattern 173, the third cut pattern 203 and the fourth cut pattern 223 may include, for example, but are not limited to, silicon oxide.

The block cut structure BC may include a first sub-cut structure BC_1 and a second sub-cut structure BC_2.

The first sub-cut structure BC_1 may completely cut the first stacked structure ST1, the second stacked structure ST2, the third stacked structure ST3, and the fourth stacked structure ST4. The first sub-cut structure BC_1 may penetrate the first cut pattern 133, the second cut pattern 173, the third cut pattern 203 and the fourth cut pattern 223.

A bottom face of the second sub-cut structure BC_2 may be placed on the same plane as the upper face of the connection placed at the uppermost part among the first connection 131, the second connection 171 and the third connection 201 which overlap in the third direction DR3.

The second sub-cut structure BC_2 does not cut the first stacked structure ST1. The second sub-cut structure BC_2 may include a second-1 sub-cut structure BC_21 that cuts only the fourth stacked structure ST4, the third stacked structure ST3 and the second stacked structure ST2, a second-2 sub-cut structure BC_22 that cuts only the fourth stacked structure ST4 and the third stacked structure ST3, and a second-3 sub-cut structure BC_23 that cuts only the fourth stacked structure ST4. The second-1 sub-cut structure BC_21 may be placed on the first connection 131, the second-2 sub-cut structure BC_22 may be placed on the second connection 171, and the second-3 sub-cut structure BC_23 may be placed on the third connection 201.

As a result, the fourth stacked structure ST4 may be divided into a plurality of stacks by the block cut structure BC. Additionally, the first stacked structure ST1, the second stacked structure ST2, and the third stacked structure ST3 are not cut by the second sub-cut structure BC_2, and includes formed connection stack. On the other hand, the fourth stacked structure ST4 is completely cut by the block cut structure BC, and therefore does not include a connection stack.

Each fourth cut pattern 223 may overlap each of the first cut patterns 133, the second cut patterns 173 and the third cut patterns 223 in the third direction DR3.

As a result, the plurality of stacks of the fourth stacked structure ST4 may be placed on the plurality of stacks of the first stacked structure ST1, the plurality of stacks of the second stacked structure ST2, and the plurality of stacks of the third stacked structure ST3. The fourth connection 221 of the fourth supporter layer 220 may connect a plurality of stacks of the fourth stacked structure ST4.

In some example embodiments, at least one of the ratio of area of the first connection 131 to the area of the first supporter layer 130, the ratio of the area of the second connection 171 to the area of the second supporter layer 170, the ratio of the area of the third connection 202 to the area of the third supporter layer 200, and the ratio of to the ratio of the area of the fourth connection CP4 to the area of the fourth supporter layer 220 may be different from each other. At least one of the number of first connections 131 included in the first supporter layer 130, the number of second connections 171 included in the second supporter layer 170, the number of third connections 202 included in the third supporter layer 200, and the number of fourth connections CP4 may be different from each other.

Unlike that shown in this drawing, the first stacked structure ST1, the second stacked structure ST2, the third stacked structure ST3, and the fourth stacked structure ST4 may not include a connection stack. As explained using FIG. 9, the side walls of the word line cut structure WLC, the block cut structure BC, and the channel structure CS may all have step. The channel structures CS may be separated from each other inside respective stacked structures ST1, ST2, ST3, and ST4.

FIGS. 20 to 25 are intermediate stage diagrams for explaining the method for fabricating the semiconductor memory device according to example embodiments. FIGS. 20 to 25 may correspond to a cross-sectional view taken along the line A-A' of FIG. 2.

Figure 20:
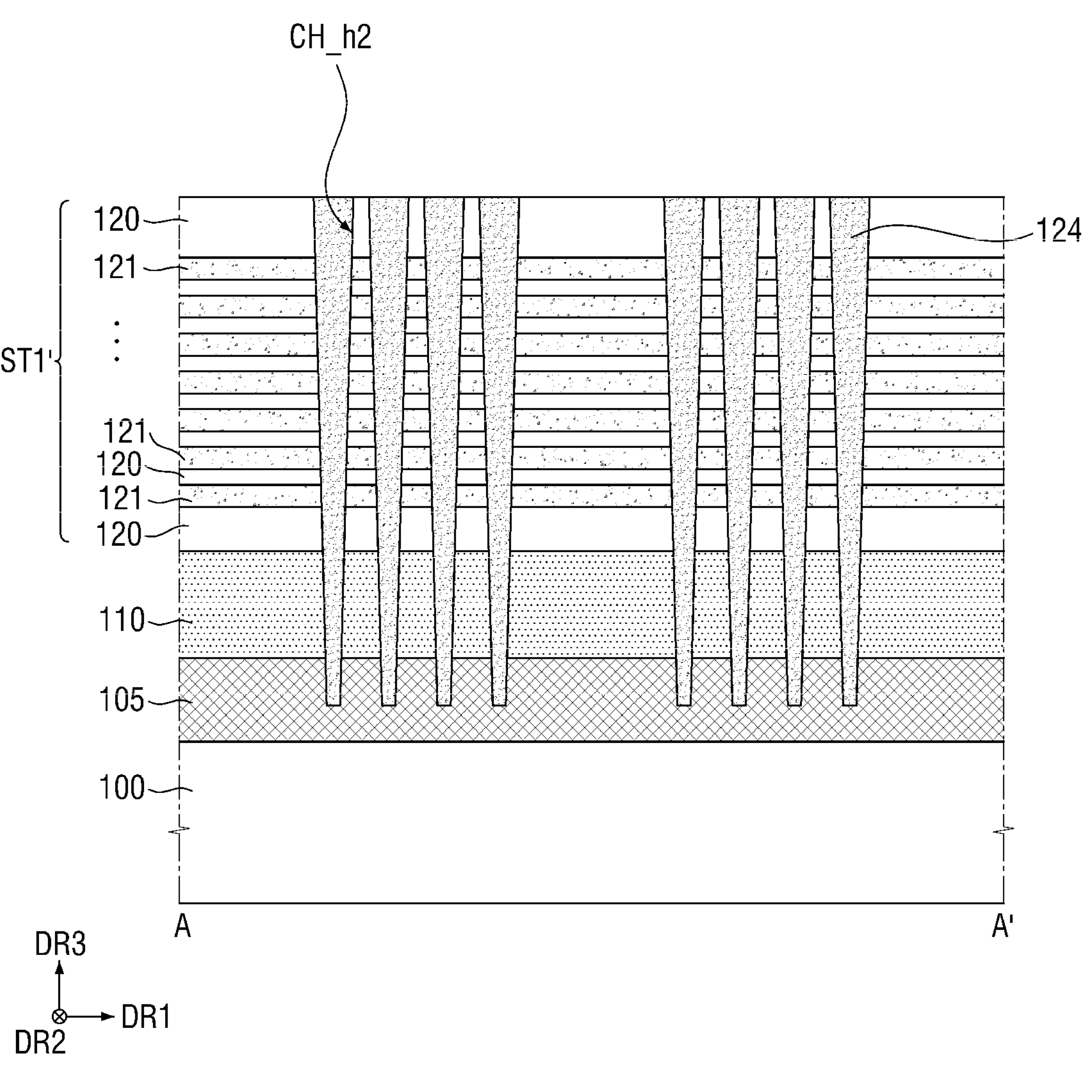
FIGS. 20 to 25 are intermediate stage diagrams for explaining the method for fabricating a semiconductor memory device according to some example embodiments.

Referring to FIG. 20, a common source plate 105 and a support semiconductor layer 110 may be formed on the substrate 100. A first pre-stacked structure ST1' including a first insulating layer 120 and a first sacrificial layer 121 stacked sequentially may be formed on the common source plate 105. The first sacrificial layer 121 may include a material having an etching selectivity, e.g. a dry etch selectivity, with the first insulating layer 120. For example, if the first insulating layer 120 includes silicon oxide, the first sacrificial layer 121 may include polysilicon.

Subsequently, a first channel hole CH_h1 penetrating the first pre-stacked structure ST1' may be formed. A channel sacrificial pattern 124 may be formed inside the first channel hole CH_h1. The channel sacrificial pattern 124 may include, for example, doped and/or undoped polysilicon, silicon oxide, silicon nitride, silicon oxynitride or a combination thereof.

Figure 21:
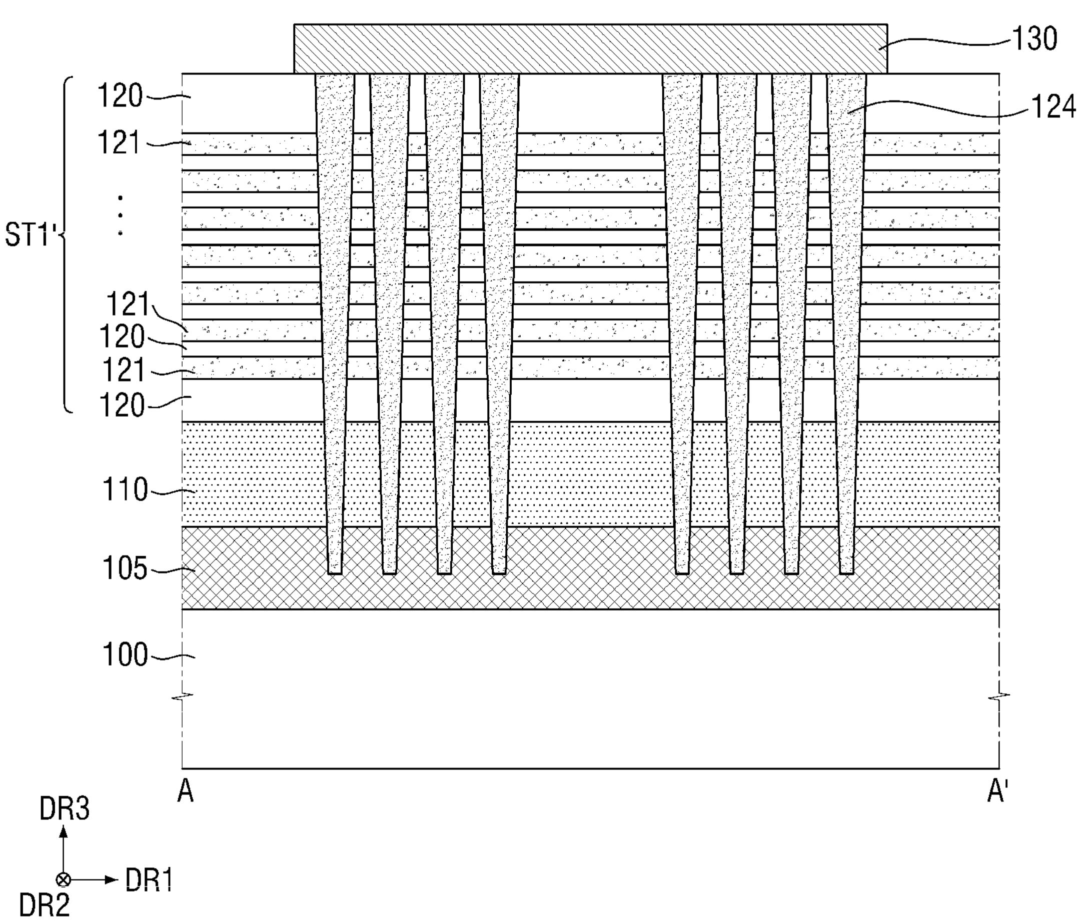

Referring to FIG. 21, the first supporter layer 130 and the first connection 131 may be formed on the first pre-stacked structure ST1'. For example, a first pre supporter layer is formed on the first pre-stacked structure ST1', and the first pre supporter layer may be patterned to form the first supporter layer 130 and the first connection 131.

Figure 22:
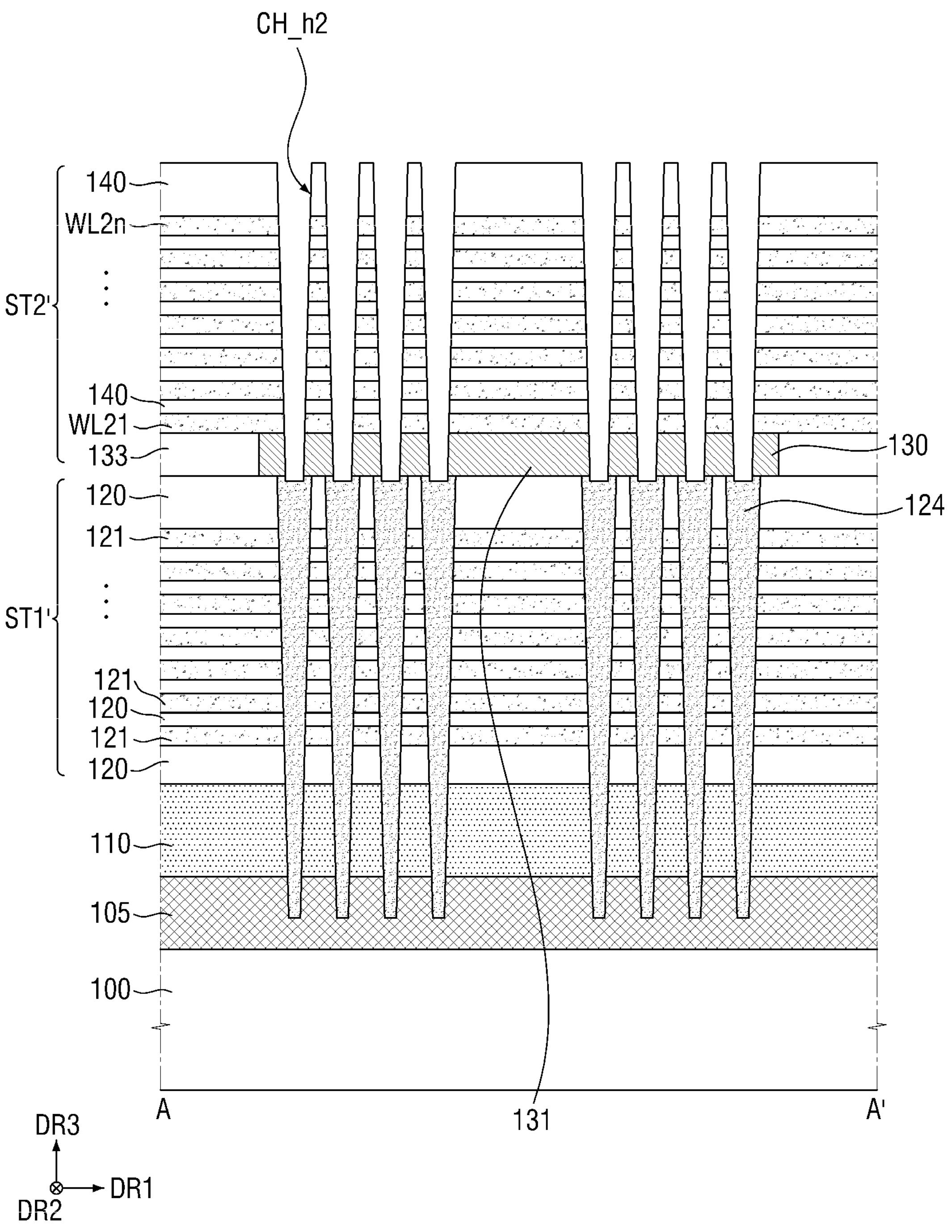

Referring to FIG. 22, the first cut pattern 133 may be formed. For example, the first cut pattern 133 may be formed on an opening in which at least a part of the upper face of the first pre-stacked structure ST1' is exposed by the first supporter layer 130 and the first connection 131.

Subsequently, a second pre-stacked structure ST2' including a second insulating layer 140 and a second sacrificial layer 141 stacked sequentially may be formed on the first supporter layer 130. The second sacrificial layer 141 may include a material having an etching selectivity with the second insulating layer 140. For example, if the second insulating layer 140 includes silicon oxide, the second sacrificial layer 141 may include polysilicon.

For example, the second sacrificial layer 141 may include the same material as the first sacrificial layer 121, and the second insulating layer 140 may include the same material as the first insulating layer 120.

Subsequently, a second pre channel hole may be formed. Since the first supporter layer 130 may include a material having a higher etching selectivity than the second sacrificial layer 141 and the second insulating layer 140, the second pre channel hole may be etched up to the upper face of the first supporter layer 130. That is, the first supporter layer 130 may serve as a channel hole etching stop film.

Subsequently, a second pre channel hole may be over etched to form a second channel hole CH_h2 that exposes at least a part of the channel sacrificial pattern 124.

Figure 23:
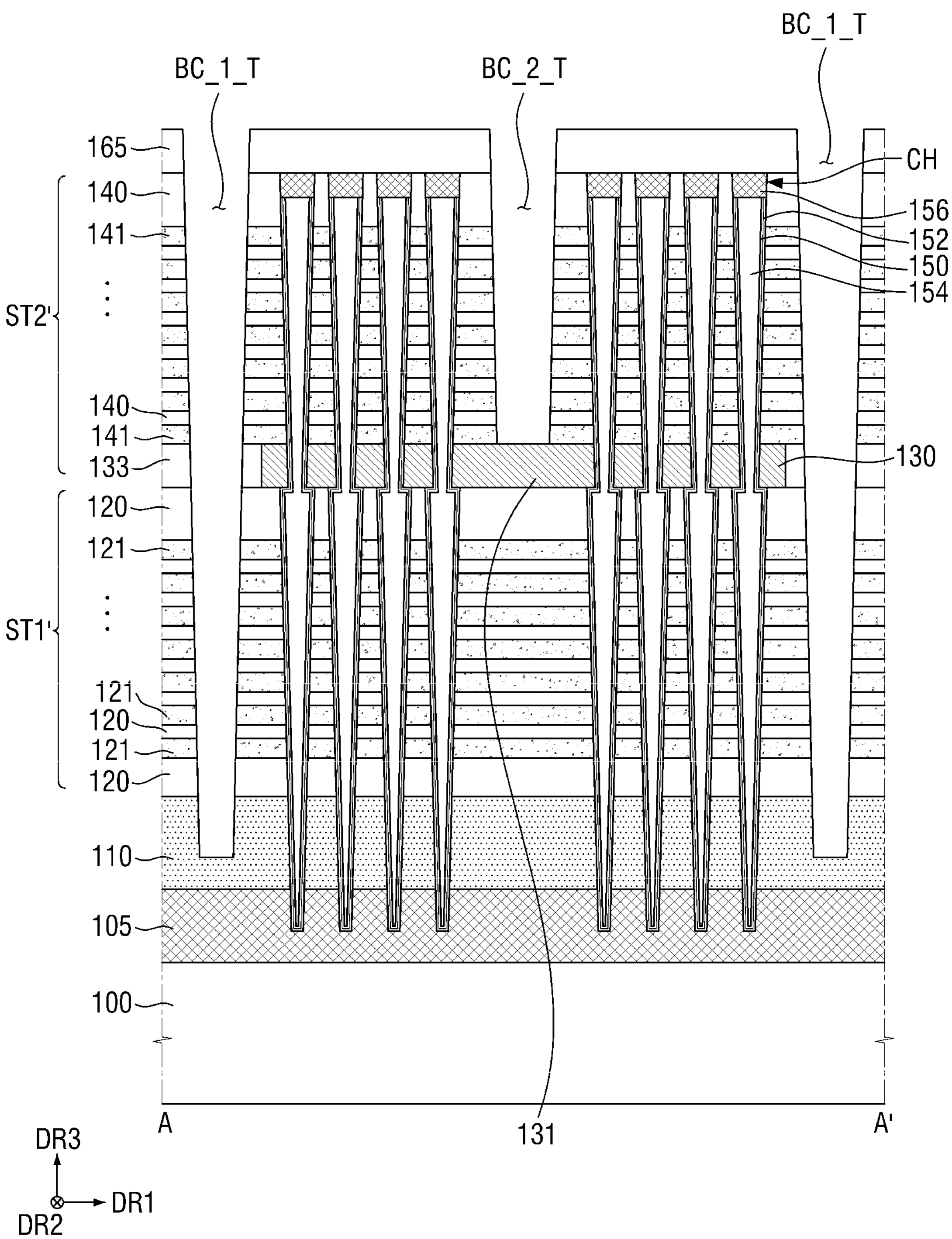

Referring to FIG. 23, the channel sacrificial pattern 124 may be removed through the second channel hole (CH_h2 of FIG. 22).

Subsequently, a channel structure CS may be formed in the first channel hole (CH_h1 of FIG. 21) and the second channel hole (CH_h2 of FIG. 22). As a result, the side walls of the channel structure CS may have a step on the lower face of the first supporter layer 130.

Subsequently, a first interlayer insulating film 165 may be formed on the second pre-stacked structure ST2'.

Subsequently, a first sub-cut trench BC_1_T and a second sub-cut trench BC_2_T may be formed.

The first sub-cut trench BC_1_T may be formed on the first cut pattern 133. The first sub-cut trench BC_1_T may penetrate the first interlayer insulating film 165, the second pre-stacked structure ST2', the first cut pattern 133 and the first pre-stacked structure ST1'. The first sub-cut trench BC_1_T may extend, for example, into a part of the support semiconductor layer 110.

The second sub-cut trench BC_2_T may penetrate the second pre-stacked structure ST2' and the first interlayer insulating film 165 and may be penetrate up to the upper face of the first supporter layer 130. That is, the first supporter layer 130 may serve as an etching stop film of the second sub-cut trench BC_2_T. As a result, the second sub-cut trench BC_2_T may be formed on the first connection 131 of the first supporter layer 130, and the first sub-cut trench BC_1_T may be formed on the first cut pattern 133 of the first supporter layer 130.

Figure 24:
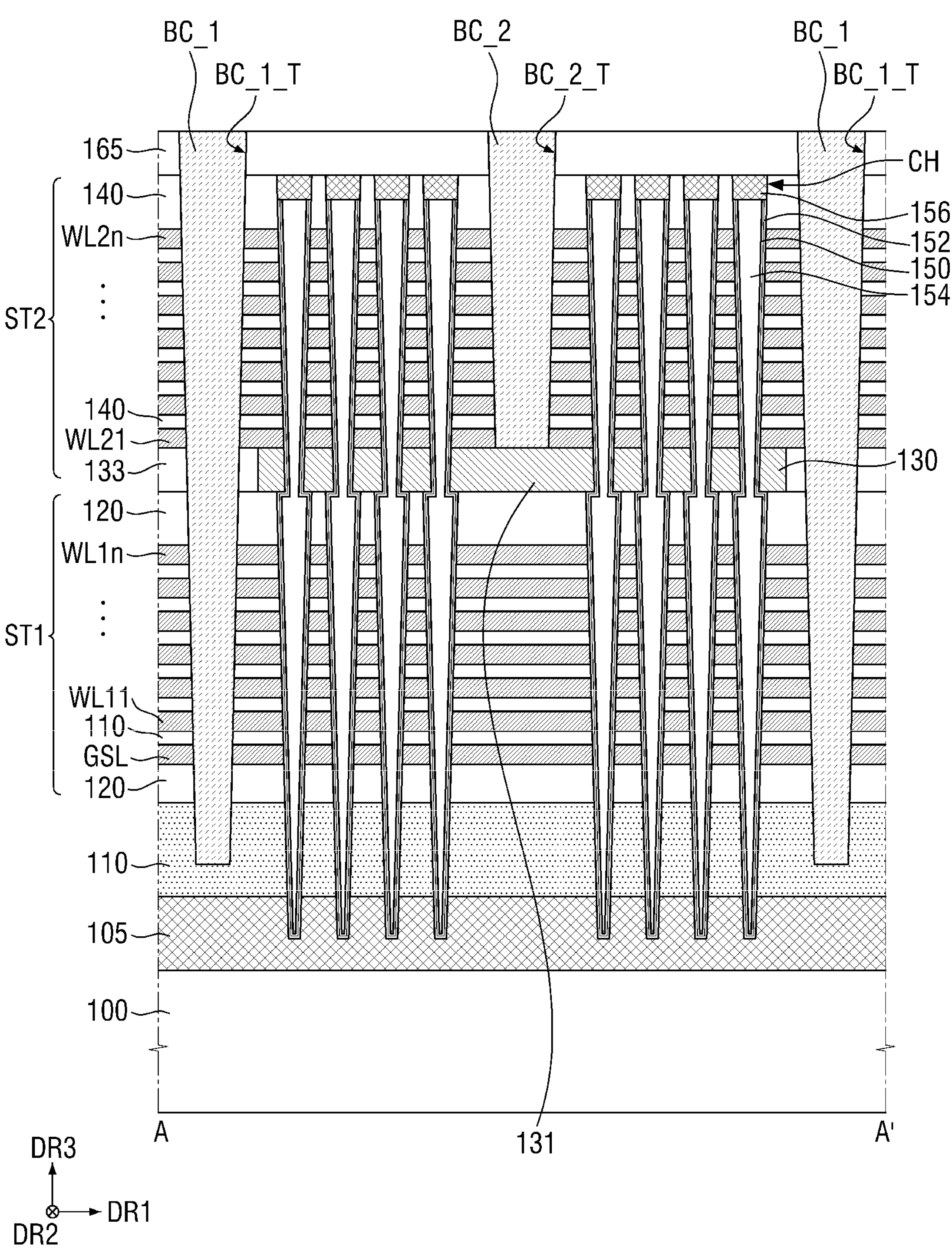

Referring to FIG. 24, the first sacrificial layer 121 and the second sacrificial layer 141 exposed by the first sub-cut trench BC_1_T and the second sub-cut trench BC_2_T may be removed.

In some example embodiments, a part of the semiconductor pattern 150 of the channel structure CH is removed while the first sacrificial layer 121 and the second sacrificial layer 141 are removed, and the information storage pattern 152 may be exposed. In some other example embodiments, after removing the first sacrificial layer 121 and the second sacrificial layer 141, a part of the semiconductor pattern 150 below the channel structure CH is removed, and the information storage pattern 152 may be exposed.

Each of the first gate electrodes GSL and WL11 to WL1*n* and the second gate electrodes WL21 to WL2*n* may be formed in the space from which the first sacrificial layer 121 and the second sacrificial layer 141 are removed.

That is, the first sacrificial layer 121 and the second sacrificial layer 141 may be replaced with the first gate electrodes GSL and WL11 to WL1*n* and the second gate electrodes WL21 to WL2*n* through the replacement metal gate process, respectively. As a result, the first stacked structure ST1 and the second stacked structure ST2 may be formed.

Subsequently, a first sub-cut structure BC_1 and a second sub-cut structure BC_2 that fill each of the first sub-cut trench BC_1_T and the second sub-cut trench BC_2_T may be formed.

Figure 25:
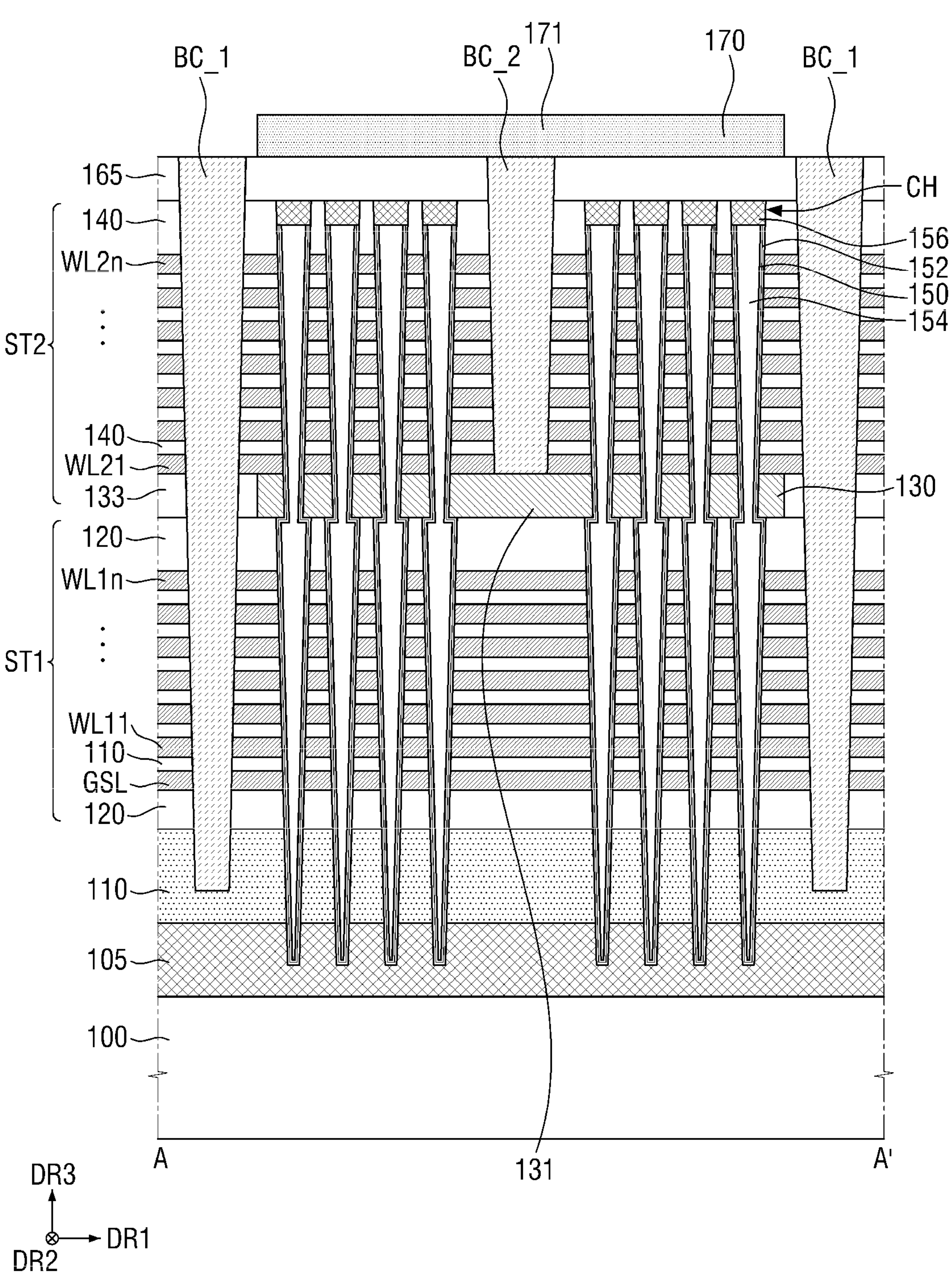

Referring to FIG. 25, a second supporter layer 170 and a second connection 171 may be formed on the first interlayer insulating film 165. For example, a second pre supporter layer is formed on the first interlayer insulating film 165, and the second pre supporter layer may be patterned to form the second supporter layer 170 and the second connection 171.

Subsequently, referring to FIG. 4, a second cut pattern 173 may be formed. For example, the second cut pattern 173 may be formed on an opening from which at least a part of the upper face of the second stacked structure ST2 is exposed, by the second supporter layer 170 and the second connection 171.

Subsequently, a bit line contact 177 penetrating the first interlayer insulating film 165 and the second supporter layer 170 is formed, a bit line 180 is formed on the second supporter layer 170, and the semiconductor memory device shown in FIG. 4 may be fabricated accordingly.

FIGS. 26 to 29 are intermediate stage diagrams for explaining a method for fabricating a semiconductor memory device according to some example embodiments. FIGS. 26 to 29 may correspond to cross-sectional views taken along the line A-A' of FIG. 3A.

Figure 26:
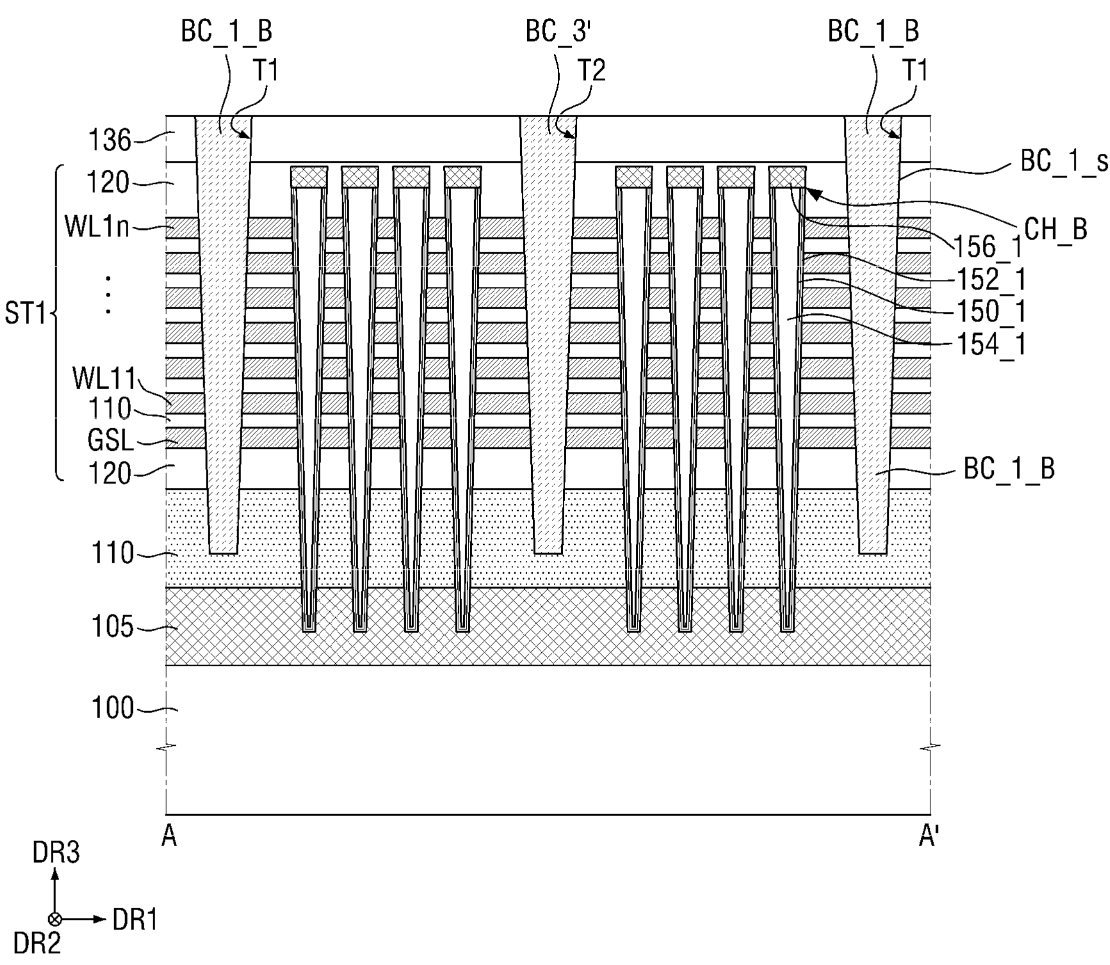
FIGS. 26 to 29 are intermediate stage diagrams for explaining the method for fabricating the semiconductor memory device according to some example embodiments.

Referring to FIG. 26, a common source plate 105 and a support semiconductor layer 110 may be formed on the substrate 100. A first pre-stacked structure including the first insulating layer 120 and the first sacrificial layer stacked sequentially may be formed on the common source plate 105.

Subsequently, a lower channel structure CH_B that penetrates the first pre-stacked structure may be formed. The lower channel structure CH_B may include a first semiconductor pattern 150_1, a first information storage pattern 152_1, a first filling pattern 154_1, and a first channel pad 156_1, as explained in FIG. 9.

Subsequently, a first pre-cut pattern 136 may be formed on the first pre-stacked structure.

Subsequently, a first trench T1 and a second trench T2 that penetrate the first pre-cut pattern 136 and the first pre-stacked structure may be formed.

Subsequently, the first sacrificial layer exposed by the first trench T1 and the second trench T2 may be removed. The first gate electrodes GSL and W11 to W1*n* may be formed in the space from which the first sacrificial layer 121 is removed. As a result, the first stacked structure ST1 may be formed.

Subsequently, a lower sub-cut structure BC_1_B may be formed in the first trench T1. A third pre sub-cut structure BC_3' may be formed in the second trench T2.

Figure 27:
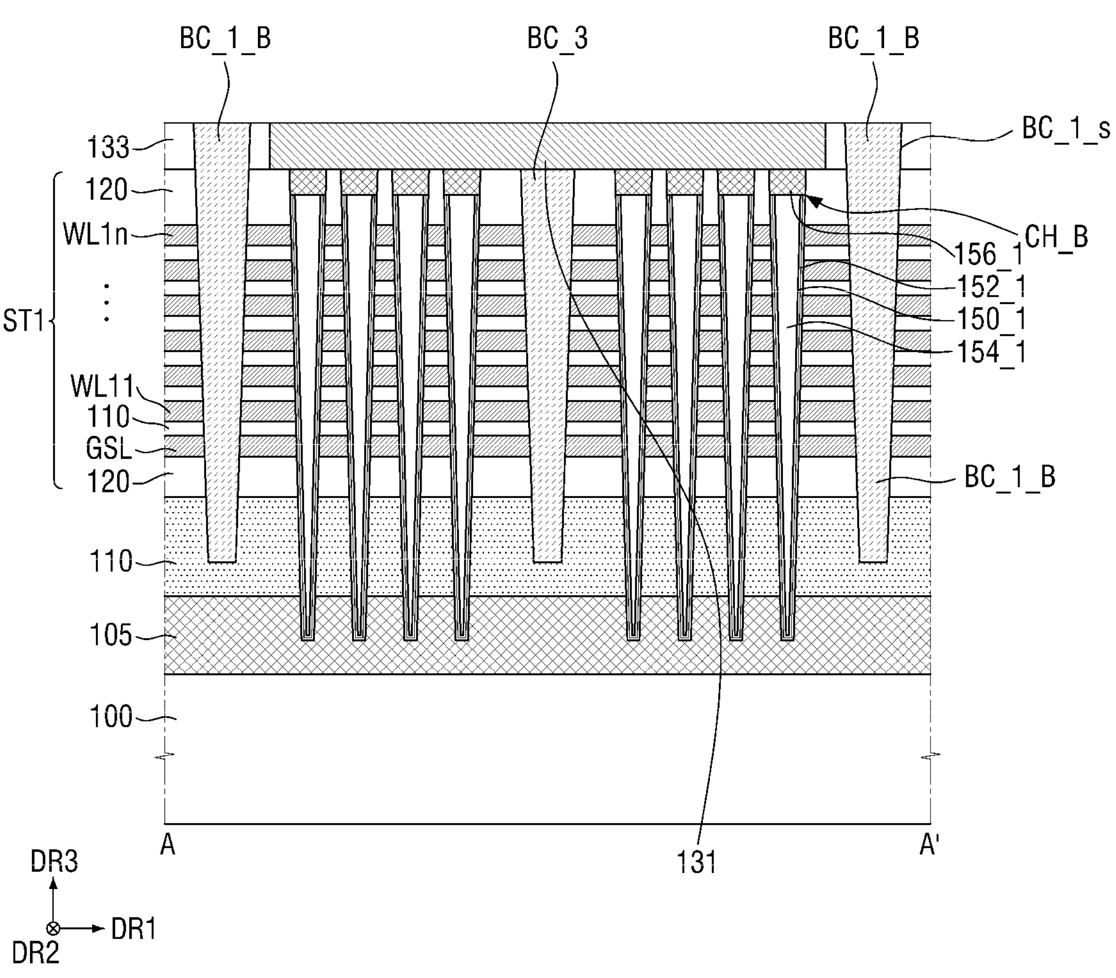

Referring to FIG. 27, a first supporter layer 130 and a first connection 131 may be formed. The first supporter layer 130 and the first connection 131 may be formed in the first pre-cut pattern (136 of FIG. 26). For example, the first pre-cut pattern (136 of FIG. 26) and the third pre sub-cut structure (BC_3' of FIG. 26) may be patterned, using a mask.

As a result, the first cut pattern 133 including the first supporter layer 130 and the first connection 131, and the third sub-cut structure BC_3 may be formed. The first supporter layer 130 may be formed in the space from which the first pre-cut pattern (136 of FIG. 26) is removed, and the first connection 131 may be formed in the space from which the third pre sub-cut structure (BC_3' of FIG. 26) is removed.

Figure 28:
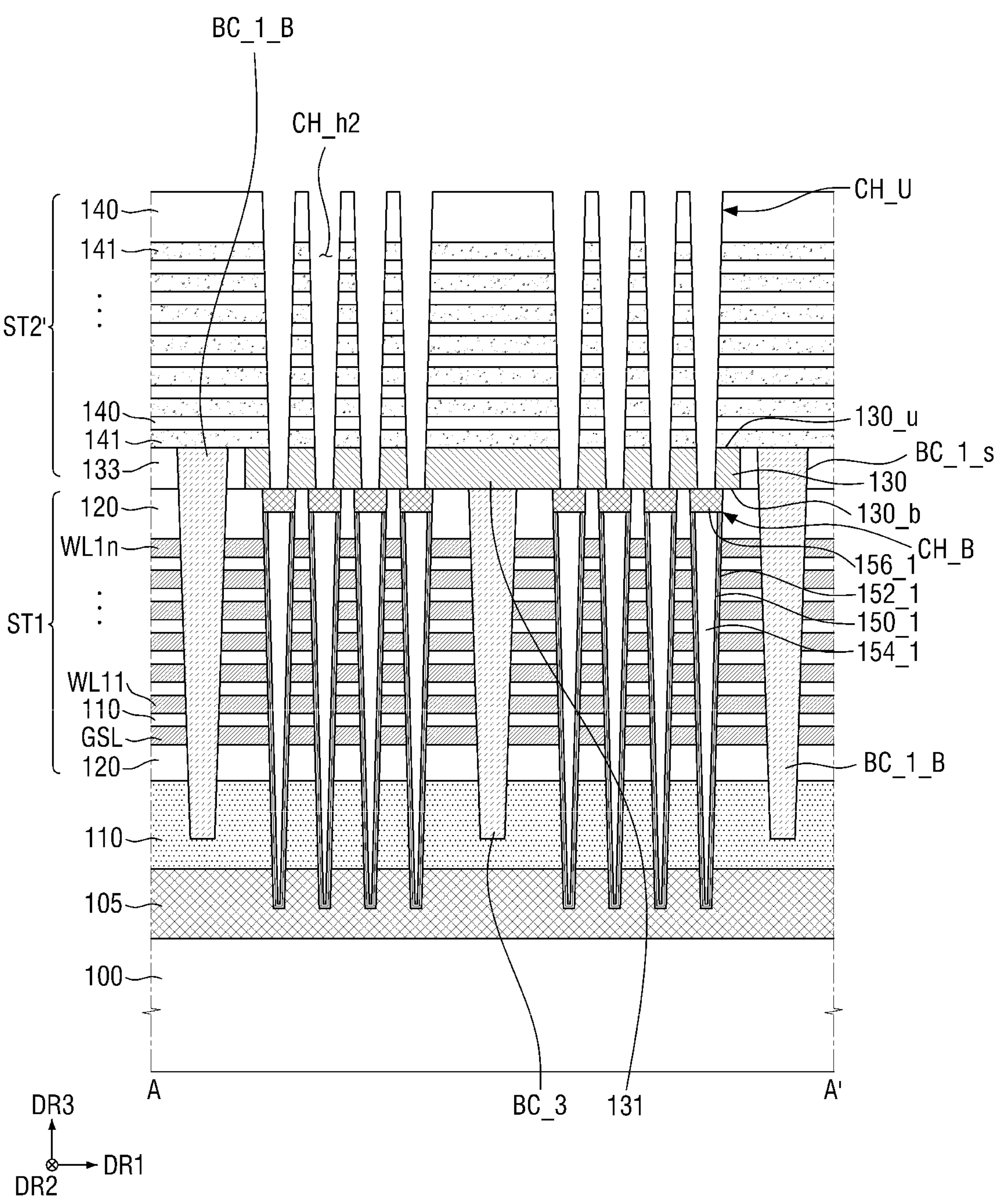

Referring to FIG. 28, a second pre-stacked structure ST2' including a second insulating layer 140 and a second sacrificial layer 141 stacked sequentially may be formed on the first supporter layer 130.

Subsequently, a second channel hole CH_h2 that exposes at least a part of the first channel pad 156_1 of the lower channel structure CH_B may be formed.

Figure 29:
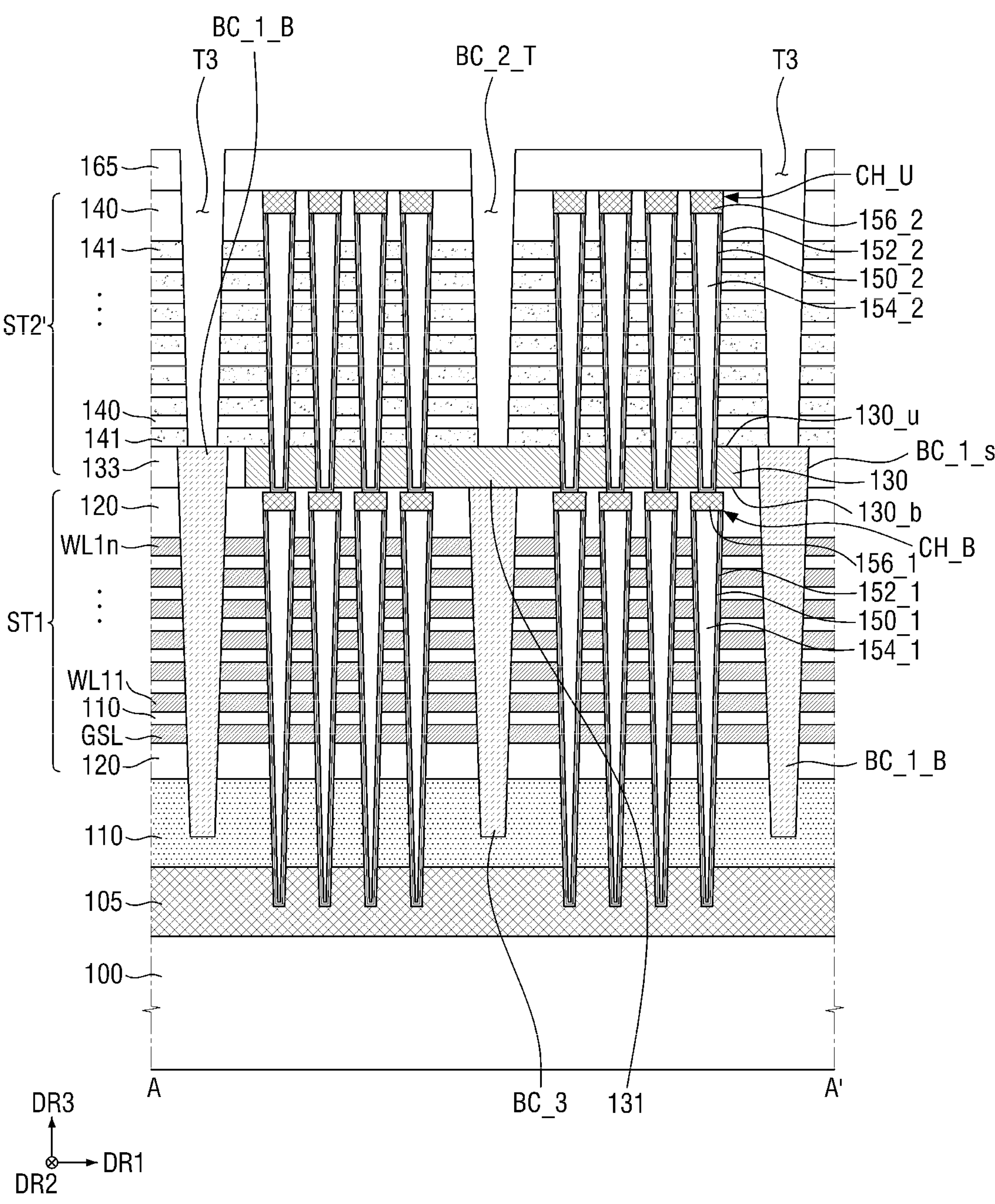

Referring to FIG. 29, an upper channel structure CH_U may be formed in the second channel hole (CH_h2 of FIG. 28). The upper channel structure CH_U may include a second semiconductor pattern 150_2, a second information storage pattern 152_2, a second filling pattern 154_2, and a second channel pad 156_2 as explained in FIG. 9. As a result, a channel structure CH may be formed.

Subsequently, the first interlayer insulating film 165 may be formed on the second pre-stacked structure ST2'.

Subsequently, a third trench T3 that penetrates the first interlayer insulating film 165 and the second pre-stacked structure ST2' may be formed on the lower sub-cut structure BC_1_B. In some example embodiments, the third trench T3 may extend into at least a part of the lower sub-cut structure BC_1_B. A second sub-cut trench BC_2_T penetrating the second pre electrode structure ST2' may be formed on the first connection 131.

Subsequently, referring to FIG. 9, the second sacrificial layer 141 exposed by the third trench T3 and the second sub-cut trench BC_2_T may be removed. The second gate electrodes WL21 to WL2*n* may be formed in the space from which the second sacrificial layer 141 is removed.

Subsequently, an upper sub-cut structure BC_1_U that fills the third trench T3 may be formed. As a result, the first sub-cut structure BC_1 may be formed, and the side walls of the first sub-cut structure BC_1 may have a step. Also, a second sub-cut structure BC_2 that fills the second sub-cut trench BC_2_T may be formed.

Subsequently, a second supporter layer 170, a second cut pattern 173, a bit line contact 177 and a bit line 180 are formed, and the semiconductor memory device shown in FIG. 9 may be fabricated accordingly.

In concluding the detailed description, those of ordinary skill in the art will appreciate that many variations and modifications may be made to example embodiments without substantially departing from the principles of inventive concepts. Therefore, the disclosed example embodiments are used in a generic and descriptive sense only and not for purposes of limitation.

What is claimed is:

1. A semiconductor memory device comprising:

a first stacked structure including first gate electrodes sequentially stacked on a substrate;

a first supporter layer disposed on the first stacked structure and divided by first cut patterns extending in a first direction, wherein each of the first cut patterns comprises first sub-cut patterns spaced apart from each other in a second direction intersecting the first direction;

a second stacked structure including second gate electrodes sequentially stacked on the first supporter layer;

a second supporter layer disposed on the second stacked structure and divided by second cut patterns extending in the first direction, wherein each of the second cut patterns comprises second sub-cut patterns spaced apart from each other in the second direction;

a third stacked structure including third gate electrodes sequentially stacked on the second supporter layer;

a third supporter layer disposed on the third stacked structure and divided by third cut patterns extending in the first direction, wherein each of the third cut patterns comprises third sub-cut patterns spaced apart from each other in the second direction; and a channel structure penetrating the first stacked structure, the first supporter layer, the second stacked structure, the second supporter layer and the third stacked structure, wherein the first supporter layer includes a first ratio of an area of the first cut patterns to an area of the first supporter layer, the second supporter layer includes a second ratio of an area of the second cut patterns to an area of the second supporter layer, the third supporter layer includes a third ratio of an area of the third cut patterns to an area of the third supporter layer, and at least one of the first ratio, the second ratio, or the third ratio is different from an other ratio of the first ratio, the second ratio, or the third ratio.

2. The semiconductor memory device of claim 1, wherein the first ratio, the second ratio, and the third ratio are each different from each other.

3. The semiconductor memory device of claim 1, wherein the second ratio is greater than the third ratio and less than the first ratio.

4. The semiconductor memory device of claim 1, wherein the second ratio is less than the third ratio and greater than the first ratio.

5. The semiconductor memory device of claim 1, wherein the second ratio is less than the first ratio and the third ratio.

6. The semiconductor memory device of claim 1, wherein side walls of the channel structure have steps at an interface between the first stacked structure and the first supporter layer and an interface between the second stacked structure and the second supporter layer.

7. The semiconductor memory device of claim 1, wherein the third supporter layer includes a material different from the first supporter layer and the second supporter layer.

8. The semiconductor memory device of claim 1, further comprising:

a fourth stacked structure including fourth gate electrodes sequentially stacked on the third supporter layer; and a fourth supporter layer disposed on the fourth stacked structure and divided by fourth cut patterns, wherein each of the fourth cut patterns comprises fourth sub-cut patterns spaced apart from each other in the second direction, the fourth supporter layer includes a fourth ratio of an area of the fourth cut patterns to an area of the fourth supporter layer, and the fourth ratio is different from at least one of the first ratio, the second ratio, or the third ratio.

9. The semiconductor memory device of claim 8, wherein the fourth supporter layer includes a material different from the first supporter layer, the second supporter layer, or the third supporter layer.

10. The semiconductor memory device of claim 1, further comprising:

a block cut structure cutting at least one of the second stacked structure or the first stacked structure.

11. A semiconductor memory device comprising:

a peripheral logic structure, and a cell array structure on the peripheral logic structure;

wherein the cell array structure includes:

a first substrate, a first stacked structure including first gate electrodes and first insulating layers alternately stacked on the first substrate, a first supporter layer disposed on the first stacked structure and divided by first cut patterns extending in a first direction, a second stacked structure including second gate electrodes and second insulating layers alternately stacked on the first supporter layer, a second supporter layer disposed on the second stacked structure and divided by second cut patterns extending in the first direction, a channel structure penetrating the first stacked structure, the first supporter layer and the second stacked structure, a first metal layer on the second supporter layer, and a first bonding metal on the first metal layer, the peripheral logic structure includes:

a second substrate, a second metal layer on the second substrate, and a second bonding metal on the second metal layer, the first bonding metal is connected to the second bonding metal, each of the first cut patterns comprises first sub-cut patterns spaced apart from each other in a second direction intersecting the first direction, each of the second cut patterns comprises second sub-cut patterns spaced apart from each other in the second direction, and a first ratio of an area of the first cut patterns to an area of the first supporter layer is different from a second ratio defined by a ratio of an area of the second cut patterns to an area of the second supporter layer.

12. The semiconductor memory device of claim 11, wherein the first ratio is less than the second ratio.

13. The semiconductor memory device of claim 11, wherein the second supporter layer includes a material different from the first supporter layer.

14. The semiconductor memory device of claim 11, further comprising:

a block cut structure cutting at least one of the second stacked structure or the first stacked structure, wherein at least part of the block cut structure overlaps at least one of the first cut patterns and the second cut patterns.

15. A semiconductor memory device comprising:

a first stacked structure including first gate electrodes and first insulating layers alternately stacked on a substrate;

a first supporter layer disposed on the first stacked structure and divided by first cut patterns extending in a first direction, wherein each of the first cut patterns comprises first sub-cut patterns spaced apart from each other in a second direction intersecting the first direction;

a second stacked structure including second gate electrodes and second insulating layers alternately stacked on the first supporter layer;

a second supporter layer disposed on the second stacked structure and divided by second cut patterns extending in the first direction, wherein each of the second cut patterns comprises second sub-cut patterns spaced apart from each other in the second direction;

a block cut structure including at least one of a first sub-cut structure cutting the first stacked structure, a second sub-cut structure cutting the second stacked structure, and a third sub-cut structure cutting the first stacked structure and the second stacked structure; and a channel structure penetrating the first stacked structure, the first supporter layer, the second stacked structure, and the second supporter layer, wherein the block cut structure overlaps at least part of the first cut patterns and at least part of the second cut patterns, the first supporter layer includes a material having a higher etching selectivity than at least one of silicon oxide and silicon nitride, and a first ratio of an area of the first cut patterns to an area of the first supporter layer is different from a second ratio of an area of the second cut patterns to an area of the second supporter layer.

16. The semiconductor memory device of claim 15, wherein side walls of the channel structure have a step, and the side walls of the block cut structure have no step.

17. The semiconductor memory device of claim 15, wherein side walls of the channel structure have a step a first level, and the side walls of the block cut structure have a step a second level lower than the first level.

18. The semiconductor memory device of claim 15, wherein the channel structure includes a lower channel structure penetrating the first stacked structure, and an upper channel structure penetrating the first supporter layer and the second stacked structure, and each of the lower channel structure and the upper channel structure includes a channel pattern, an information storage film and channel pad.

19. The semiconductor memory device of claim 15, wherein the third sub-cut structure includes a first portion cutting the first stacked structure, and the first supporter layer and a second portion connecting the first portion cutting the second stacked structure.

20. The semiconductor memory device of claim 15, wherein the third sub-cut structure includes a first portion cutting the first stacked structure and not cutting the first supporter layer, and a second portion cutting the second stacked structure.

* * * * *